(12) United States Patent
Kawashima et al.

(10) Patent No.: US 11,257,457 B2
(45) Date of Patent: Feb. 22, 2022

(54) DISPLAY DEVICE AND OPERATION METHOD THEREOF

(71) Applicant: Semiconductor Energy Laboratory Co., Ltd., Kanagawa-ken (JP)

(72) Inventors: Susumu Kawashima, Kanagawa (JP); Kouhei Toyotaka, Kanagawa (JP); Koji Kusunoki, Kanagawa (JP); Kei Takahashi, Kanagawa (JP); Kentaro Hayashi, Kanagawa (JP)

(73) Assignee: Semiconductor Energy Laboratory Co., Ltd.

( * ) Notice: Subject to any disclaimer, the term of this patent is extended or adjusted under 35 U.S.C. 154(b) by 0 days.

(21) Appl. No.: 16/971,137

(22) PCT Filed: Feb. 14, 2019

(86) PCT No.: PCT/IB2019/051177
§ 371 (c)(1),
(2) Date: Aug. 19, 2020

(87) PCT Pub. No.: WO2019/162808
PCT Pub. Date: Aug. 29, 2019

(65) Prior Publication Data
US 2021/0110783 A1  Apr. 15, 2021

(30) Foreign Application Priority Data

Feb. 23, 2018 (JP) .............................. JP2018-030779
Mar. 13, 2018 (JP) .............................. JP2018-045614

(51) Int. Cl.
*G09G 5/10* (2006.01)
*G09G 3/36* (2006.01)
(Continued)

(52) U.S. Cl.
CPC ......... *G09G 3/3688* (2013.01); *G09G 3/3413* (2013.01); *G09G 3/3677* (2013.01);
(Continued)

(58) Field of Classification Search
CPC .. G09G 3/3677; G09G 3/3688; G09G 3/3413; G09G 2320/0242;
(Continued)

(56) References Cited

U.S. PATENT DOCUMENTS 6,597,348 B1   7/2003  Yamazaki et al.
7,053,873 B2 * 5/2006  Tsutsui ................. G09G 3/2011
                                                  345/204
(Continued)

FOREIGN PATENT DOCUMENTS

JP      2002-318395 A     10/2002
JP      2002318395 A  *  10/2002  ............... G09G 3/36
(Continued)

OTHER PUBLICATIONS

International Search Report (Application No. PCT/IB2019/051177) dated May 28, 2019.
(Continued)

*Primary Examiner* — Adam J Snyder
(74) *Attorney, Agent, or Firm* — Husch Blackwell LLP

(57) ABSTRACT

A display device operating at high speed is provided.
The display device includes a pixel provided with a first memory circuit, a second memory circuit, and a display unit, in which the first memory circuit and the second memory circuit are electrically connected to one electrode of the display unit. The operation of the display device includes a first period of writing first image data to the first memory circuit and writing second image data to the second memory circuit, a second period of supplying a first potential to the first memory circuit, a third period of displaying a first
(Continued)

image corresponding to the first image data, a fourth period of setting a potential of the one electrode of the display unit to a second potential, a fifth period of supplying the first potential to the second memory circuit, and a sixth period of displaying a second image corresponding to the second image data.

14 Claims, 20 Drawing Sheets

(51) Int. Cl.
    *G09G 3/34*     (2006.01)
    *H01L 29/786*     (2006.01)

(52) U.S. Cl.
    CPC ............... *G09G 2300/0426* (2013.01); *G09G 2300/0465* (2013.01); *G09G 2300/0852* (2013.01); *G09G 2310/0235* (2013.01); *G09G 2310/0262* (2013.01); *G09G 2320/0242* (2013.01); *G09G 2320/0252* (2013.01); *H01L 29/786* (2013.01)

(58) Field of Classification Search
    CPC ... G09G 2320/0252; G09G 2300/0426; G09G 2310/0235; G09G 2310/0262; H01L 29/786; G90G 2300/0465; G09G 2300/0852
    See application file for complete search history.

(56) References Cited

U.S. PATENT DOCUMENTS

| | | | |
|---|---|---|---|
| 7,317,438 B2 | 1/2008 | Yamazaki et al. | |
| 7,385,579 B2 | 6/2008 | Satake | |
| 7,403,177 B2 | 7/2008 | Tanada et al. | |
| 7,702,705 B2 | 4/2010 | Suzuki | |
| 7,773,066 B2 | 8/2010 | Yamazaki et al. | |
| 7,791,571 B2 | 9/2010 | Ohtani et al. | |
| 7,834,830 B2 | 11/2010 | Yamazaki et al. | |
| 7,855,770 B2 | 12/2010 | Egi et al. | |
| 7,941,471 B2 | 5/2011 | Katz et al. | |
| 8,823,754 B2 | 9/2014 | Koyama et al. | |
| 9,135,877 B2 | 9/2015 | Koyama et al. | |
| 9,368,090 B2 | 6/2016 | Koyama et al. | |
| 2002/0021274 A1* | 2/2002 | Koyama | G09G 3/3648 345/98 |
| 2002/0041266 A1* | 4/2002 | Koyama | G09G 3/3648 345/87 |
| 2004/0041768 A1 | 3/2004 | Chen et al. | |
| 2005/0168570 A1* | 8/2005 | Kim | G09G 3/3659 348/71 |
| 2007/0279374 A1 | 12/2007 | Kimura et al. | |
| 2008/0055216 A1* | 3/2008 | Yen | G09G 3/3648 345/87 |
| 2008/0136983 A1* | 6/2008 | Huang | G09G 3/3659 349/38 |
| 2010/0039425 A1* | 2/2010 | Chen | G09G 3/3659 345/214 |
| 2010/0235418 A1 | 9/2010 | Dong | |
| 2010/0321420 A1 | 12/2010 | Ohtani et al. | |
| 2011/0001725 A1 | 1/2011 | Kurokawa | |
| 2011/0025729 A1 | 2/2011 | Yamazaki et al. | |
| 2011/0051034 A1 | 3/2011 | Egi et al. | |
| 2011/0248978 A1* | 10/2011 | Koyama | G09G 3/3696 345/211 |
| 2011/0249037 A1 | 10/2011 | Koyama et al. | |
| 2011/0292088 A1 | 12/2011 | Toyotaka et al. | |
| 2011/0316818 A1 | 12/2011 | Koyama et al. | |

FOREIGN PATENT DOCUMENTS

| | | |
|---|---|---|
| JP | 2005-107382 A | 4/2005 |
| JP | 2007-155890 A | 6/2007 |
| JP | 2007-155983 A | 6/2007 |
| JP | 2009-053594 A | 3/2009 |
| JP | 2012-003236 A | 1/2012 |
| JP | 2012-003238 A | 1/2012 |
| JP | 2012-141569 A | 7/2012 |
| JP | 2015-210422 A | 11/2015 |
| JP | 2016-053729 A | 4/2016 |
| TW | 571280 B | 1/2004 |
| WO | WO 2000/014713 A1 | 3/2000 |
| WO | WO 2011/125688 A1 | 10/2011 |

OTHER PUBLICATIONS

Written Opinion (Application No. PCT/IB2019/051177) dated May 28, 2019.

Shishido, H. et al., "28.2: Color Sequential LC Display Using High Reliable Oxide Semiconductors With Monochrome Electronic Paper Function," SID Digest '11: SID International Symposium Digest of Technical Papers, 2011, vol. 42, No. 1, pp. 369-372, Jun. 2011.

\* cited by examiner

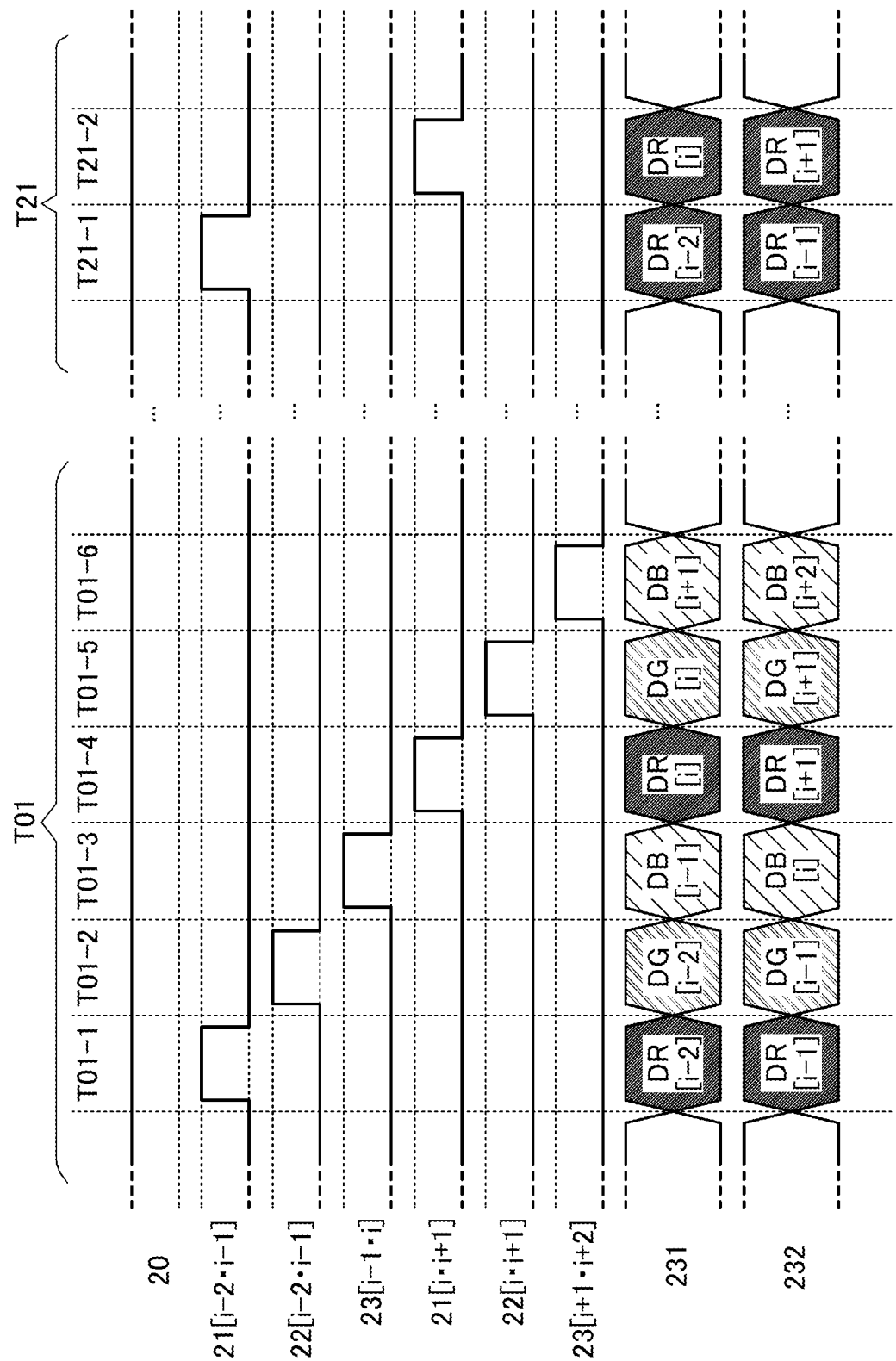

DISPLAY DEVICE AND OPERATION METHOD THEREOF

This application is a 371 of international application PCT/IB2019/051177 filed on Feb. 14, 2019 which is incorporated herein by reference.

TECHNICAL FIELD

One embodiment of the present invention relates to a display device and an operation method thereof.

Note that one embodiment of the present invention is not limited to the above technical field. The technical field of one embodiment of the invention disclosed in this specification and the like relates to an object, a method, or a manufacturing method. Alternatively, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, an imaging device, a driving method thereof, and a manufacturing method thereof.

In this specification and the like, a semiconductor device generally means a device that can function by utilizing semiconductor characteristics. A transistor and a semiconductor circuit are embodiments of semiconductor devices. In some cases, a memory device, a display device, an imaging device, or an electronic device includes a semiconductor device.

BACKGROUND ART

A color filter method and a field sequential method are known as display methods for a display device including a liquid crystal unit as a display unit, for example. In a display device performing the former method, each pixel includes a plurality of subpixels provided with color filters transmitting only light whose wavelengths exhibit specific colors (e.g., red, green, and blue). Transmission of white light is controlled in each subpixel, and a plurality of colors are mixed in each pixel, whereby a desired color is produced. By contrast, in a display device performing the latter method, a plurality of light sources, such as backlights, which emit light of different colors (e.g., red, green, and blue) from each other are provided. The plurality of light sources sequentially emit light, and transmission of light of each color is controlled in each pixel, whereby a desired color is produced. In other words, the former method is a method of dividing the area of one pixel by light of specific colors to produce a desired color, whereas the latter method is a method of dividing a display period by light of specific colors to produce a desired color.

The display device performing display by a field-sequential method has the following advantages over the display device performing display by a color-filter method. First, in the display device employing a field-sequential method, it is not necessary to provide subpixels in each pixel. Thus, the aperture ratio can be increased or the number of pixels can be increased. In addition, in the display device employing a field-sequential method, it is not necessary to provide color filters. In other words, light loss caused by light absorption in color filters does not occur. Therefore, light transmittance can be improved and power consumption can be reduced.

Patent Documents 1 and 2 disclose display devices performing display by a field-sequential method. Specifically, in Patent Document 1, image data is supplied concurrently to pixels located in a plurality of rows, whereby frequency of inputting the image data to each pixel can be increased without changing the response speed of a transistor or the like included in the display device. In Patent Document 2, image data is written to pixels located in a specific row, which is followed by writing of image data to pixels located in a row apart from the specific row. In this manner, the writing of image data and lighting of a backlight for a specific pixel can be performed sequentially, instead of performing the writing of image data and lighting of a backlight for all pixel pixels at once.

Furthermore, there has been demand for display devices with high resolution. For example, display devices including a large number of pixels such as full high definition (the number of pixels: 1920×1080), 4K (the number of pixels: 3840×2160, 4096×2160, or the like), and 8K (the number of pixels: 7680×4320, 8192×4320, or the like) have been actively developed.

Moreover, there has been demand for larger display devices. For example, the screen size of mainstream home-use television devices has been 50 inches diagonal or more. A larger screen size allows a larger amount of information to be displayed at a time, and a further increase in screen size has been demanded for digital signage and the like.

REFERENCE

Patent Document

[Patent Document 1] Japanese Published Patent Application No. 2012-003236
[Patent Document 2] Japanese Published Patent Application No. 2012-141569

SUMMARY OF THE INVENTION

Problems to be Solved by the Invention

In a display device performing display by a field-sequential method and including a liquid crystal unit as a display unit, a color sequential method in which writing of image data and light emission from a light source are performed in each pixel is employed to operate, thereby prolonging a latency of a response from the display unit due to a reduction in display unevenness or the like. This, for example, prevents an increase in frame frequency, and light emission time of the light source becomes shorter than that in the case of using a color filter method in some cases. Thus, an image seen by a user of the display device may be dark. In some cases, a phenomenon called color break in which images of various colors are not synthesized but perceived separately occurs. The above phenomenon may be noticeable in the case where the number of pixels and the size of the display device are increased.

One object of one embodiment of the present invention is to provide a display device operating at high speed. Alternatively, one object is to provide a display device that enables a user to see a bright image. Alternatively, one object is to provide a display device that can display a high-quality image. Alternatively, one object is to provide a display device with a large number of pixels. Alternatively, one object is to provide a large-sized display device. Alternatively, one object is to provide a display device with a high aperture ratio. Alternatively, one object is to provide a display device with low power consumption. Alternatively, one object is to provide a highly reliable display device.

Alternatively, one object is to provide a novel display device. Alternatively, one object is to provide a novel semiconductor device or the like.

Alternatively, one object is to provide an operation method of a display device operating at high speed. Alternatively, one object is to provide an operation method of a display device that enables a user to see a bright image. Alternatively, one object is to provide an operation method of a display device that can display a high-quality image. Alternatively, one object is to provide an operation method of a display device with a large number of pixels. Alternatively, one object is to provide an operation method of a large-sized display device. Alternatively, one object is to provide an operation method of a display device with a high aperture ratio. Alternatively, one object is to provide an operation method of a display device with low power consumption. Alternatively, one object is to provide an operation method of a high reliable display device. Alternatively, one object is to provide an operation method of a novel display device. Alternatively, one object is to provide an operation method of a novel semiconductor device or the like.

Note that the descriptions of these objects do not disturb the existence of other objects. One embodiment of the present invention does not have to achieve all the objects. Other objects will be apparent from and can be derived from the description of the specification, the drawings, the claims, and the like.

Means for Solving the Problems

One embodiment of the present invention is a method for operating a display device including a pixel provided with a first memory circuit, a second memory circuit, and a display unit, in which the first memory circuit and the second memory circuit are electrically connected to one electrode of the display unit. The method includes a first period of writing first image data to the first memory circuit and writing second image data to the second memory circuit; a second period of supplying a first potential to the first memory circuit; a third period of displaying a first image corresponding to the first image data; a fourth period of setting a potential of the one electrode of the display unit to a second potential; a fifth period of supplying the first potential to the second memory circuit; and a sixth period of displaying a second image corresponding to the second image data.

Alternatively, in the above embodiment, the first image may be an image of a first color and the second image may be an image of a second color.

Alternatively, in the above embodiment, the first color may be one of red, green, and blue, and the second color may be one of red, green, and blue, which is other than the first color.

Alternatively, in the above embodiment, the display unit may be a liquid crystal unit.

Alternatively, in the above embodiment, the display device may include a source driver. The source driver may be electrically connected to the first memory circuit through a first data line and electrically connected to the second memory circuit through a second data line, and may have a function of generating the first image data, the second image data, and the first potential.

Alternatively, in the above embodiment, the first memory circuit may include a first transistor and a first capacitor; the second memory circuit may include a second transistor and a second capacitor; one of a source and a drain of the first transistor may be electrically connected to one electrode of the first capacitor; one of a source and a drain of the second transistor may be electrically connected to one electrode of the second capacitor; and the other electrode of the first capacitor and the other electrode of the second capacitor may be electrically connected to the one electrode of the display unit.

Alternatively, in the above embodiment, each of the first transistor and the second transistor may include a metal oxide in a channel formation region, and the metal oxide may include In, Zn, and M (M is Al, Ti, Ga, Sn, Y, Zr, La, Ce, Nd, or Hf).

Alternatively, one embodiment of the present invention is a display device including a first pixel, a second pixel, and a source driver, where the first pixel includes a first memory circuit, a second memory circuit, and a first display unit, where the second pixel includes a third memory circuit, a fourth memory circuit, and a second display unit, where the first memory circuit is electrically connected to a first data line, where the first memory circuit is electrically connected to one electrode of the first display unit, where the second memory circuit is electrically connected to a second data line, where the second memory circuit is electrically connected to the one electrode of the first display unit, where the third memory circuit is electrically connected to the second data line, where the third memory circuit is electrically connected to one electrode of the second display unit, where the fourth memory circuit is electrically connected to the first data line, where the fourth memory circuit is electrically connected to the one electrode of the second display unit, where the source driver is electrically connected to the first data line and the second data line, where the source driver has a function of generating first image data, second image data, third image data, fourth image data, and a first potential, where the first memory circuit has a function of retaining the first image data, where the second memory circuit has a function of retaining the second image data, where the third memory circuit has a function of retaining the third image data, where the fourth memory circuit has a function of retaining the fourth image data, where the first pixel has a function of reading the first image data from the first memory circuit when the first potential is supplied to the first memory circuit, where the first pixel has a function of reading the second image data from the second memory circuit when the first potential is supplied to the second memory circuit, where the second pixel has a function of reading the third image data from the third memory circuit when the first potential is supplied to the third memory circuit, and where the second pixel has a function of reading the fourth image data from the fourth memory circuit when the first potential is supplied to the fourth memory circuit.

Alternatively, in the above embodiment, the display device may include a first transistor. One of a source and a drain of the first transistor may be electrically connected to the one electrode of the first display unit and the one electrode of the second display unit, the other of the source and the drain of the first transistor may be electrically connected to a power supply line, and the source driver may have a function of generating the first to fourth image data in a period when the first transistor is in a conduction state and have a function of generating the first potential in a period when the first transistor is in a non-conduction state.

Alternatively, in the above embodiment, the first image data and the third image data may each represent an image of a first color, and the second image data and the fourth image data may each represent an image of a second color.

Alternatively, in the above embodiment, the first color may be one of red, green, and blue, and the second color may be one of red, green, and blue, which is other than the first color.

Alternatively, in the above embodiment, the display unit may be a liquid crystal unit.

Alternatively, in the above embodiment, the first memory circuit may include a second transistor and a first capacitor, the second memory circuit may include a third transistor and a second capacitor, the third memory circuit may include a fourth transistor and a third capacitor, and the fourth memory circuit may include a fifth transistor and a fourth capacitor. One of a source and a drain of the second transistor may be electrically connected to one electrode of the first capacitor. The other of the source and the drain of the second transistor may be electrically connected to the first data line. The other electrode of the first capacitor may be electrically connected to the one electrode of the first display unit. One of a source and a drain of the third transistor may be electrically connected to one electrode of the second capacitor. The other of the source and the drain of the third transistor may be electrically connected to the second data line. The other electrode of the second capacitor may be electrically connected to the one electrode of the first display unit. One of a source and a drain of the fourth transistor may be electrically connected to one electrode of the third capacitor. The other of the source and the drain of the fourth transistor may be electrically connected to the second data line. The other electrode of the third capacitor may be electrically connected to the one electrode of the second display unit. One of a source and a drain of the fifth transistor may be electrically connected to one electrode of the fourth capacitor. The other of the source and the drain of the fifth transistor may be electrically connected to the first data line. The other electrode of the fourth capacitor may be electrically connected to the one electrode of the second display unit. A gate of the first transistor may be electrically connected to a gate of the third transistor.

Alternatively, in the above embodiment, each of the second to fifth transistors may include a metal oxide in a channel formation region, and the metal oxide may include In, Zn, and M (M is Al, Ti, Ga, Sn, Y, Zr, La, Ce, Nd, or Hf).

Alternatively, one embodiment of the present invention is a method for operating a display device including a pixel provided with a first memory circuit, a second memory circuit, and a display unit, in which the first memory circuit and the second memory circuit are electrically connected to one electrode of the display unit. The display device operates with a first operation of writing first image data to the first memory circuit and writing second image data to the second memory circuit, a second operation of supplying a first potential to the first memory circuit and setting a potential of the one electrode of the display unit to a second potential after a first image corresponding to the first image data is displayed, and a third operation of supplying the first potential to the second memory circuit and setting a potential of the one electrode of the display unit to the second potential after a second image corresponding to the second image data is displayed. The second operation and the third operation are each performed two or more times after the first operation is performed one time.

Alternatively, in the above embodiment, the first image may be an image of a first color and the second image may be an image of a second color.

Alternatively, in the above embodiment, the first color may be any one of red, green, and blue, and the second color may be one of red, green, and blue and other than the first color.

Alternatively, in the above embodiment, the display unit may be a liquid crystal unit.

Alternatively, in the above embodiment, the pixel may include a reset transistor. One of a source and a drain of the reset transistor may be electrically connected to one electrode of the display unit, and the second potential may be supplied to the other of the source and the drain of the reset transistor. The reset transistor may include a metal oxide in a channel formation region, and the metal oxide may include In, Zn, and M (M is Al, Ti, Ga, Sn, Y, Zr, La, Ce, Nd, or Hf).

Alternatively, in the above embodiment, the display device may include a source driver. The source driver may be electrically connected to the first memory circuit through a first data line. The source driver may be electrically connected to the second memory circuit through a second data line. The source driver may have a function of generating the first image data, the second image data, and the first potential.

Alternatively, in the above embodiment, the first memory circuit may include a first transistor and a first capacitor, and the second memory circuit includes a second transistor and a second capacitor. One of a source and a drain of the first transistor may be electrically connected to one electrode of the first capacitor. One of a source and a drain of the second transistor may be electrically connected to one electrode of the second capacitor. The other electrode of the first capacitor and the other electrode of the second capacitor may be electrically connected to the one electrode of the display unit.

Alternatively, in the above embodiment, each of the first transistor and the second transistor may include a metal oxide in a channel formation region, and the metal oxide may include In, Zn, and M (M is Al, Ti, Ga, Sn, Y, Zr, La, Ce, Nd, or Hf).

Effect of the Invention

According to one embodiment of the present invention, a display device operating at high speed can be provided. Alternatively, a display device that enables a user to see a bright image can be provided. Alternatively, a display device that can display a high-quality image can be provided. Alternatively, a display device with a large number of pixels can be provided. Alternatively, a large-sized display device can be provided. Alternatively, a display device with a high aperture ratio can be provided. Alternatively, a display device with low-power consumption can be provided. Alternatively, a highly reliable display device can be provided. Alternatively, a novel display device can be provided. Alternatively, a novel semiconductor device or the like can be provided.

Alternatively, an operation method of a display device operating at high speed can be provided. Alternatively, an operation method of a display device that enables a user to see a bright image can be provided. Alternatively, an operation method of a display device that can display a high-quality image can be provided. Alternatively, an operation method of a display device with a large number of pixels can be provided. Alternatively, an operation method of a large-sized display device can be provided. Alternatively, an operation method of a display device with a high aperture ratio can be provided. Alternatively, an operation method of a display device with low power consumption can be provided. Alternatively, an operation method of a highly reliable display device can be provided. Alternatively, an operation method of a novel display device can be provided. Alternatively, an operation method of a novel semiconductor device or the like can be provided.

BRIEF DESCRIPTION OF THE DRAWINGS

FIG. 14 A timing chart illustrating an example of an operation method of a display device.

MODE FOR CARRYING OUT THE INVENTION

Figure 1A:
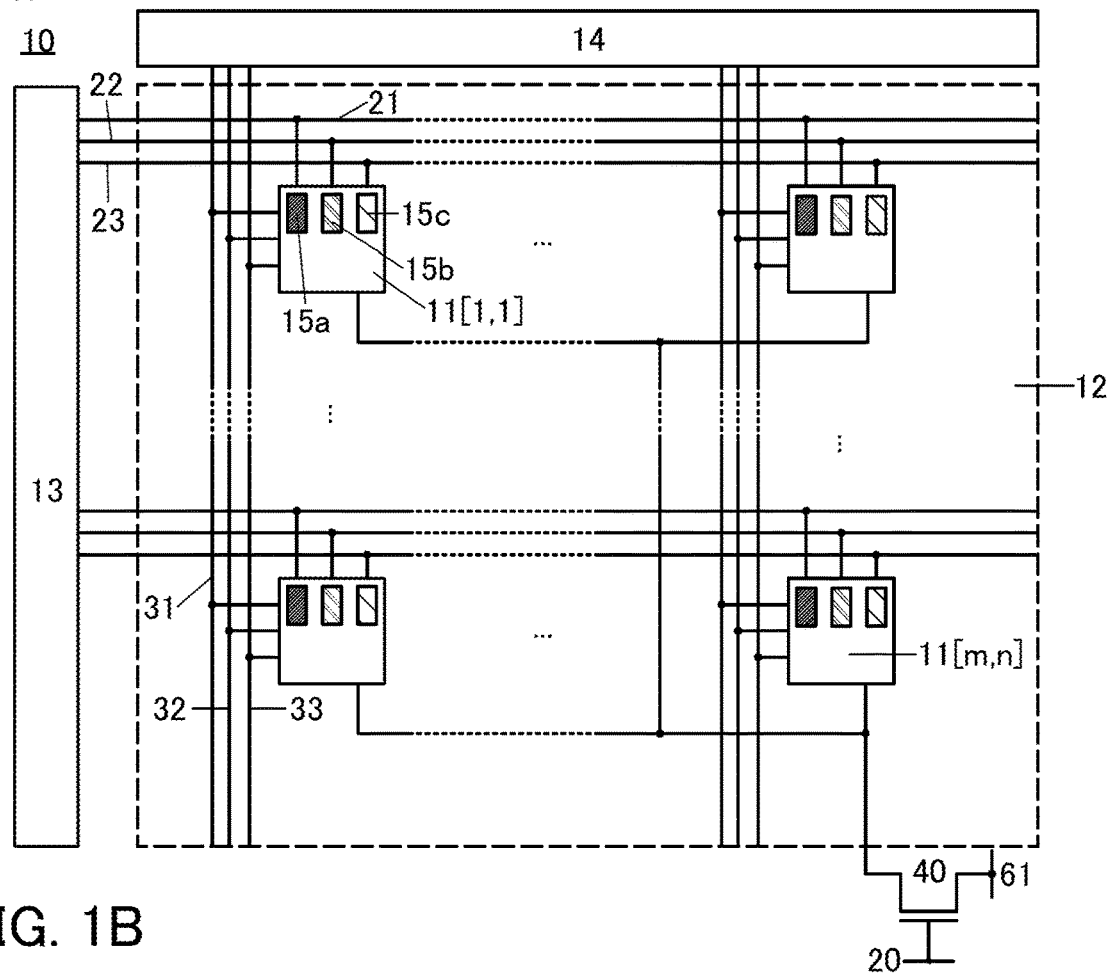
FIGS. 1 (A) and (B) are a block diagram illustrating a structure example of a display device and a circuit diagram illustrating a structure example of a pixel circuit, respectively.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be interpreted as being limited to the description of embodiments below. Note that in structures of the invention described below, the same portions or portions having similar functions are denoted by the same reference numerals in different drawings, and the description thereof is not repeated in some cases. The same components are denoted by different hatching patterns in different drawings, or the hatching patterns are omitted in some cases.

Embodiment 1

In this embodiment, a display device of one embodiment of the present invention and an operation method thereof will be described with reference to drawings.

One embodiment of the present invention is an operation method of a display device in which pixels each of which includes a first memory circuit and a second memory circuit are arranged in a matrix. First, first image data is written to the first memory circuit, and second image data is written to the second memory circuit. Next, an offset potential is supplied to the first memory circuit, whereby the first image data retained in the first memory circuit is read and an image corresponding to the first image data is displayed on a display portion of the display device. Next, a reset operation is performed. After that, an offset potential is supplied to the second memory circuit, whereby the second image data retained in the second memory circuit is read and an image corresponding to the second image data is displayed on the display portion.

In the above-described operation method, the writing of the first image data to the first memory circuit and the writing of the second image data to the second memory circuit are performed on the pixels row by row, that is, performed in a line-sequential manner. In contrast, the supply of the offset potential to the first memory circuit, the reset operation, and the supply of the offset potential to the second memory circuit can be performed, for example, concurrently on all pixels, that is, performed in a frame-sequential manner. In other words, the first image data and the second image data can be read in a frame-sequential manner. By reading the image data in a frame-sequential manner, generation of display unevenness can be suppressed even when an image is displayed before a display unit completely responds. Thus, the display device can operate at high speed. In particular, a large-sized display device with a large number of pixels can operate at high speed.

In addition, the display device of one embodiment of the present invention includes a source driver in addition to the above pixels. The first memory circuit provided in the pixel is electrically connected to the first memory circuit through a first data line and electrically connected to the second memory circuit through a second data line. Accordingly, the writing of the first image data to the first memory circuit and the writing of the second image data to the second memory circuit can be performed in parallel. Thus, the display device can operate at higher speed than the case where each pixel is electrically connected to one data line.

The operation method of a display device of one embodiment of the present invention can be applied to a display device which performs display by, for example, a field-sequential method and includes a liquid crystal unit as a display unit. Such a display device is provided with a plurality of light sources, such as backlights, emitting light of different colors (for example, red, green, and blue colors) from each other. The plurality of light sources emit light sequentially, and transmission of light of each color is controlled in each pixel, whereby an image is displayed. In other words, a display period is time-divided by light exhibiting specific colors. Therefore, a display device that does not operate at high speed has a risk of reducing frame frequencies, for example, leading to occurrence of color break or the like. Furthermore, the emission time of the light sources is shortened and an image seen by a user of the display device becomes dark in some cases.

In the operation method of a display device of one embodiment of the present invention, the first image data can be image data corresponding to one color of red, green, and blue, for example. The second image data can be image data corresponding to one color different from that of the first image data. Accordingly, by switching an image displayed on the display device from an image corresponding to the first image data to an image corresponding to the second image data, a color of the image to be displayed can be changed. As described above, in the operation method of the display device of one embodiment of the present invention, an image to be displayed can be switched at high speed; accordingly, even when display is performed by a field-sequential method, the frame frequency can be increased and, for example, occurrence of color break can be suppressed. Thus, the quality of an image displayed on the display device can be improved. Furthermore, since the light emission time of the light sources can be long, an image seen by a user of the display device can be bright even when the emission intensity of the light sources is low. In particular, the quality of an image displayed on a large-sized display device can be improved, and an image seen by a user of the large-sized display device can be bright.

FIG. 1(A) is a diagram illustrating a structure example of a display device 10 that is a display device of one embodiment of the present invention. The display device 10 includes a display portion 12 in which pixels 11 are arranged in a matrix of m rows and n columns, a gate driver 13, a source driver 14, and a transistor 40. In addition, each pixel 11 includes a memory circuit 15a, a memory circuit 15b, and a memory circuit 15c.

In this specification and the like, for example, the pixel 11 in the first row and the first column is referred to as a pixel 11[1,1], and the pixel 11 in the m-th row and the n-th column is referred to as a pixel 11[m,n]. Note that similar expression may be employed for other components.

The pixel 11 is electrically connected to the other pixels 11 in the same row through a wiring 21, electrically connected to the other pixels 11 in the same row through a wiring 22, and electrically connected to the other pixels 11 in the same row through a wiring 23. Furthermore, the pixel 11 is electrically connected to the other pixels 11 in the same column through a wiring 31, electrically connected to the other pixels 11 in the same column through a wiring 32, and electrically connected to the other pixels 11 in the same column through a wiring 33.

The gate driver 13 is electrically connected to m wirings 21, m wirings 22, and m wirings 23. The source driver 14 is electrically connected to n wirings 31, n wirings 32, and n wirings 33.

One of a source and a drain of the transistor 40 is, for example, electrically connected to all of the pixels 11. The other of the source and the drain of the transistor 40 is electrically connected to a wiring 61. A gate of the transistor 40 is electrically connected to a wiring 20. Here, the wiring 61 functions as a power source line.

The gate driver 13 has a function of supplying a signal to the pixel 11 through the wiring 21 and controlling operation of the pixel 11. The gate driver 13 has a function of supplying a signal to the pixel 11 through the wiring 22 and controlling operation of the pixel 11. The gate driver 13 has a function of supplying a signal to the pixel 11 through the wiring 23 and controlling operation of the pixel 11. The wiring 21 to the wiring 23 function as scan lines.

The source driver 14 has a function of generating image data or the like. The source driver 14 has a function of supplying the generated image data or the like to the pixel 11 through the wiring 31. The source driver 14 has a function of supplying the generated image data or the like to the pixel 11 through the wiring 32. The source driver 14 has a function of supplying the generated image data or the like to the pixel 11 through the wiring 33. The wiring 31 to the wiring 33 function as data lines.

The source driver 14 has a function of generating an offset potential and supplying the generated offset potential to the pixel 11 through the wiring 31 to the wiring 33; the details will be described later.

In this specification and the like, image data indicates data expressing an image displayed on the display portion 12 or the like. In other words, the display portion 12 can be regarded as having a function of displaying an image corresponding to image data.

The memory circuit 15a has a function of retaining image data supplied to the pixel 11 through the wiring 31. The memory circuit 15b has a function of retaining image data supplied to the pixel 11 through the wiring 32. The memory circuit 15c has a function of retaining image data supplied to the pixel 11 through the wiring 33.

The transistor 40 functions as a switch. The conduction or non-conduction of the transistor 40 is controlled on the basis of a signal supplied through the wiring 20. By turning on the transistor 40, a potential of the wiring 61 is supplied to the pixel 11. As the transistor 40, a transistor containing Si in a channel formation region (hereinafter, Si transistor) can be used. Examples of the Si transistor include a transistor containing amorphous silicon, a transistor containing crystalline silicon (typically, low-temperature polysilicon), and a transistor containing single crystal silicon.

Although FIG. 1(A) illustrates a structure in which the display device 10 includes only one transistor 40, the display device of one embodiment of the present invention is not limited thereto. For example, a structure including two or more transistors 40 may be employed. For example, m transistors 40 may be provided in the display device 10, and each transistor 40 may be electrically connected to the pixels 11 in one row. For example, n transistors 40 may be provided in the display device 10, and each transistor 40 may be electrically connected to the pixels 11 in one column. Alternatively, m·n transistors 40 may be provided in the display device 10, and each transistor 40 may be electrically connected to one pixel 11. When the number of the transistors 40 is increased, the potential of the wiring 61 can be supplied to the pixel 11 at high speed, and accordingly, the operation speed of the display device 10 can be increased.

Although the transistor 40 is an n-channel transistor in FIG. 1(A), it may be a p-channel transistor or a CMOS transistor. Furthermore, the transistor 40 may be an element other than a transistor as long as it functions as a switch.

The display device 10 can display an image by a field-sequential method. In this case, image data supplied to the pixel 11 through the wiring 31, image data supplied to the pixel 11 through the wiring 32, and image data supplied to the pixel 11 through the wiring 33 can be image data corresponding to different colors. For example, in the case where the display device 10 displays images with red, green, and blue colors, the image data supplied to the pixel 11 through the wiring 31 can be image data representing a red image. The image data supplied to the pixel 11 through the wiring 32 can be image data representing a green image, and the image data supplied to the pixel 11 through the wiring 33 can be image data representing a blue image.

The display device 10 does not necessarily have a function of performing display by a field-sequential method. In this case, the image data supplied to the pixel 11 through the wiring 31, the image data supplied to the pixel 11 through the wiring 32, and the image data supplied to the pixel 11 through the wiring 33 can each be image data representing all of a red image, a green image, and a blue image. Note that in the case where the display device 10 does not have a function of performing display by a field-sequential method, the display portion 12 can include pixels, for example, each of which is composed of a subpixel having a function of displaying a red image, a subpixel having a function of displaying a green image, and a subpixel having a function of displaying a blue image. In this case, the pixel 11 corresponds to the subpixel.

The display device 10 may have a function of displaying an image with a white color, besides red, green, and blue colors. In addition to the above colors or instead of the above colors, the display device 10 may have a function of displaying an image with yellow, magenta, cyan, or the like.

Figure 1B:
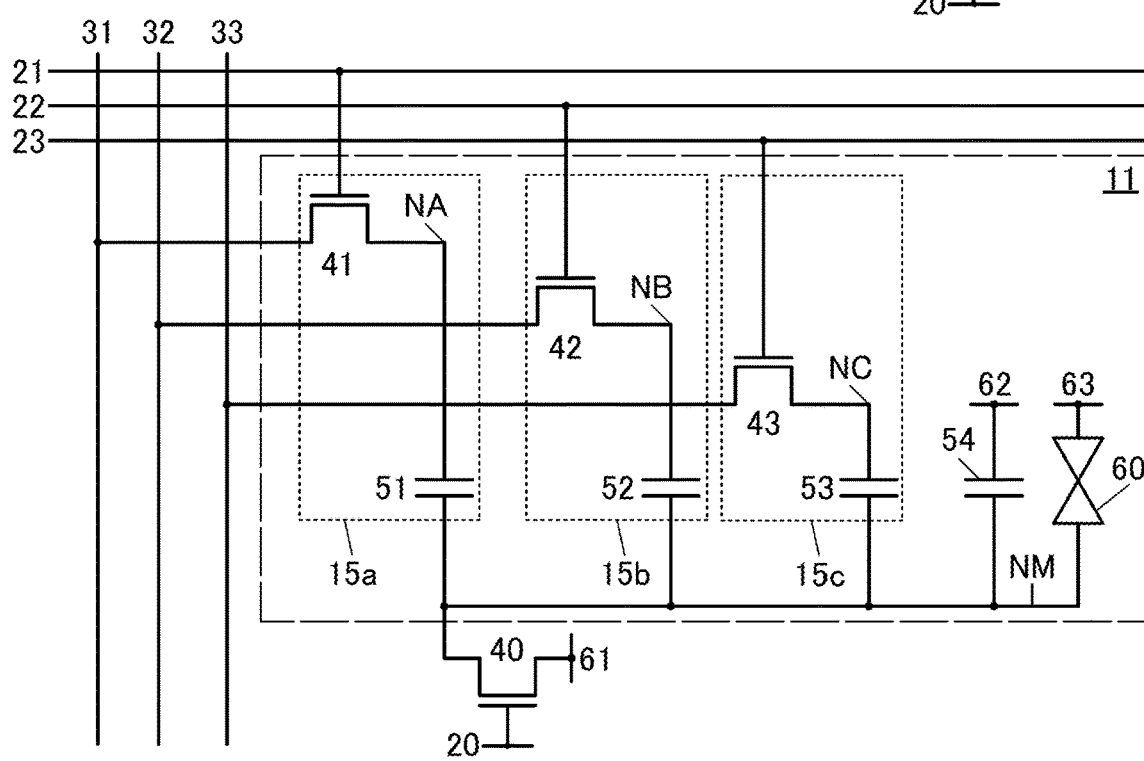

FIG. 1(B) is a circuit diagram illustrating a structure example of the pixel 11. Note that FIG. 1(B) illustrates the transistor 40 as well as the pixel 11. The pixel 11 includes a capacitor 54 and a display unit 60 in addition to the memory circuit 15a, the memory circuit 15b, and the memory circuit 15c. The memory circuit 15a includes a transistor 41 and a capacitor 51, the memory circuit 15b includes a transistor 42 and a capacitor 52, and the memory circuit 15c includes a transistor 43 and a capacitor 53. Although all of the transistor 41 to the transistor 43 are n-channel transistors in FIG. 1(B), some or all of the transistors may be p-channel transistors.

Here, a liquid crystal unit can be used as the display unit 60, for example. In this case, a light source such as a backlight is provided in the display device 10. Light emitted from the light source is emitted to a display surface of the display portion 12 through the display unit 60 that is a liquid crystal unit. Transmittance of light from the display unit 60 is controlled, whereby an image can be displayed on the display portion 12. Thus, the display device 10 can be a transmissive liquid crystal display device. Note that the light source is not illustrated in FIG. 1(A).

In the case where the display device 10 has a function of performing display by a field-sequential method, light sources emitting light of different colors (e.g., red, green, and blue colors) are provided. The plurality of light sources sequentially emit light, and light transmission of the display unit 60 is controlled every time the light source emitting light is switched, whereby an image is displayed on the display portion 12. In other words, a display period is time-divided by colors.

One of a source and a drain of the transistor 41 is electrically connected to one electrode of the capacitor 51. One of a source and a drain of the transistor 42 is electrically connected to one electrode of the capacitor 52. One of a source and a drain of the transistor 43 is electrically connected to one electrode of the capacitor 53.

The other electrode of the capacitor 51 is electrically connected to the other electrode of the capacitor 52. The other electrode of the capacitor 52 is electrically connected to the other electrode of the capacitor 53. The other electrode of the capacitor 53 is electrically connected to one electrode of the capacitor 54. The one electrode of the capacitor 54 is electrically connected to one electrode of the display unit 60. The one electrode of the display unit 60 is electrically connected to the one of the source and the drain of the transistor 40. The description above can indicate that the memory circuit 15a, the memory circuit 15b, and the memory circuit 15c are electrically connected to the one electrode of the capacitor 54, the one electrode of the display unit 60, and the one of the source and the drain of the transistor 40.

A node that is electrically connected to the one of the source and the drain of the transistor 41 and the one electrode of the capacitor 51 is referred to as a node NA. Note that a node that is electrically connected to the one of the source and the drain of the transistor 42 and the one electrode of the capacitor 52 is referred to as a node NB. Note that a node that is electrically connected to the one of the source and the drain of the transistor 43 and the one electrode of the capacitor 53 is referred to as a node NC. Furthermore, a node that is electrically connected to the other electrodes of the capacitor 51 to the capacitor 53, the one electrode of the capacitor 54, the one electrode of the display unit 60, and the one of the source and the drain of the transistor 40 is referred to as a node NM. The description above can indicate that the node NA is provided in the memory circuit 15a, the node NB is provided in the memory circuit 15b, and the node NC is provided in the memory circuit 15c.

The other of the source and the drain of the transistor 41 is electrically connected to the wiring 31. The other of the source and the drain of the transistor 42 is electrically connected to the wiring 32. The other of the source and the drain of the transistor 43 is electrically connected to the wiring 33. The description above can indicate that the memory circuit 15a is electrically connected to the wiring 31, the memory circuit 15b is electrically connected to the wiring 32, and the memory circuit 15c is electrically connected to the wiring 33.

A gate of the transistor 41 is electrically connected to the wiring 21. A gate of the transistor 42 is electrically connected to the wiring 22. A gate of the transistor 43 is electrically connected to the wiring 23. The other electrode of the capacitor 54 is electrically connected to a wiring 62. The other electrode of the display unit 60 is electrically connected to a wiring 63. The wiring 62 and the wiring 63 each function as a power supply line. A ground potential is supplied to each of the wiring 62 and the wiring 63, for example. Note that some or all of the wiring 61 to the wiring 63 may be electrically connected to each other. For example, the wiring 61 may be electrically connected to the wiring 63.

The transistor 40 functions as a switch as described above, and when the transistor 40 is turned on, a potential of the node NM becomes a potential of the wiring 61 having a function of a power supply line. Thus, when the transistor 40 is turned on, the potential of the node NM is reset. Accordingly, the transistor 40 can be referred to as a reset transistor. In the case where the transistor 40 is a switching element other than a transistor, the transistor 40 can be referred to as a reset switch.

The transistor 41 to the transistor 43 each have a function of a switch. Here, the conduction or non-conduction of the transistor 41 is controlled on the basis of a signal supplied through the wiring 21. Conduction or non-conduction of the transistor 42 is controlled on the basis of a signal supplied through the wiring 22. Furthermore, conduction or non-conduction of the transistor 43 is controlled on the basis of a signal supplied through the wiring 23.

The transistor 41 is turned on, whereby image data supplied through the wiring 31, or the like, is written to the node NA as a charge (potential). The transistor 42 is turned on, whereby image data supplied through the wiring 32, or the like, is written to the node NB as a charge (potential).

The transistor 43 is turned on, whereby image data supplied through the wiring 33, or the like, is written to the node NC as a charge (potential).

Here, transistors with an extremely low off-state current are used for the transistor 41 to the transistor 43, whereby leakage of charges held at the node NA, the node NB, and the node NC can be made extremely small. Thus, the potentials of the node NA, the node NB, and the node NC can be held for a long time. As such transistors, a transistor using a metal oxide in a channel formation region (hereinafter referred to as an OS transistor) can be used, for example.

As a semiconductor material used for an OS transistor, a metal oxide whose energy gap is greater than or equal to 2 eV, preferably greater than or equal to 2.5 eV, further preferably greater than or equal to 3 eV can be used. A typical example is an oxide semiconductor containing indium, and a CAAC-OS or a CAC-OS described later can be used, for example. The CAAC-OS is a crystalline oxide semiconductor. A transistor using the oxide semiconductor with high crystallinity can have improved reliability and thus is favorably used for the display device of one embodiment of the present invention. A CAC-OS has high mobility characteristics and is suitable for a transistor that operates at high speed, and the like.

An OS transistor has a large energy gap and thus has an extremely low off-state current characteristics. An OS transistor has features such that impact ionization, an avalanche breakdown, a short-channel effect, or the like does not occur, which are different from those of a Si transistor. Thus, the use of an OS transistor enables formation of a highly reliable circuit. Note that some or all of the transistor 41 to the transistor 43 may be Si transistors.

In the case where the display device 10 has a function of performing display by a field-sequential method, image data retained in the memory circuit 15*a*, image data retained in the memory circuit 15*b*, and image data retained in the memory circuit 15*c* can be image data corresponding to different colors. For example, in the case where the display device 10 displays images with red, green, and blue colors, the memory circuit 15*a* can retain image data representing a red image. Furthermore, the memory circuit 15*b* can retain image data representing a green image, and the memory circuit 15*c* can retain image data representing a blue image.

Figure 2:
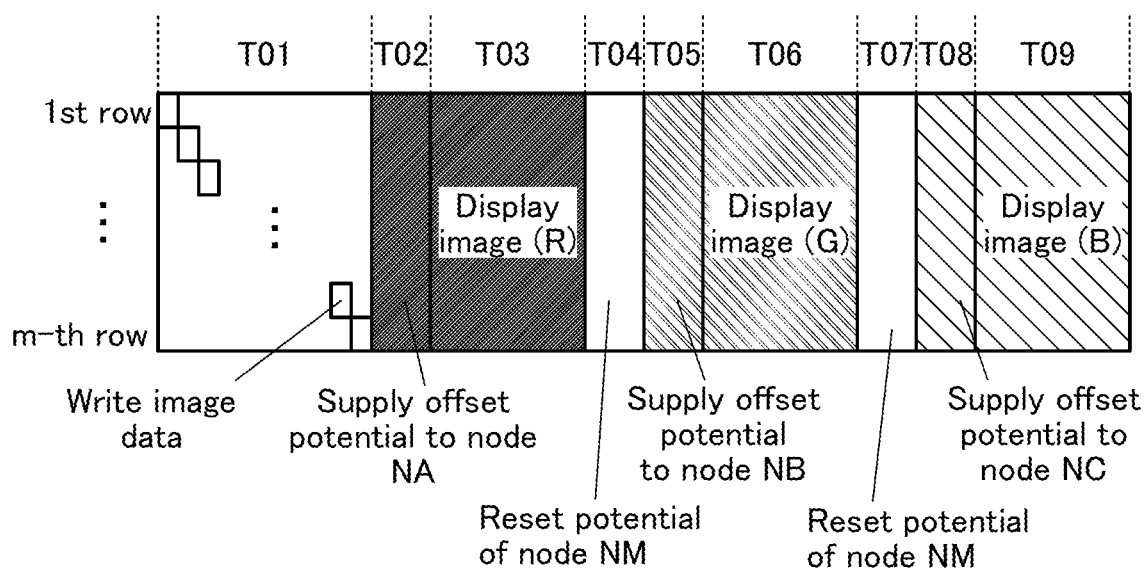
FIG. 2 A diagram illustrating an example of an operation method of a display device.

Next, an example of an operation method of the display device 10 in the case where the display device 10 performs display by a field-sequential method will be described. FIG. 2 is a diagram illustrating an example of an operation method of the display device 10, which shows operation from a period T01 to a period T09. Here, an image of one frame is displayed on the display portion 12 from the period T01 through the period T09. Specifically, a red image, a green image, and a blue image are sequentially displayed, whereby a color image of one frame is displayed on the display portion 12. In FIG. 2 and the like, the highest portion shows operation of the pixel 11 in the first row, and the lowest portion shows operation of the pixel 11 in the m-th row.

In this specification and the like, an image (R) indicates a red image, an image (G) indicates a green image, and an image (B) indicates a blue image. In addition, image data DR indicates image data representing the image (R), image data DG indicates image data representing the image (G), and image data DB indicates image data representing the image (B).

Figure 3:
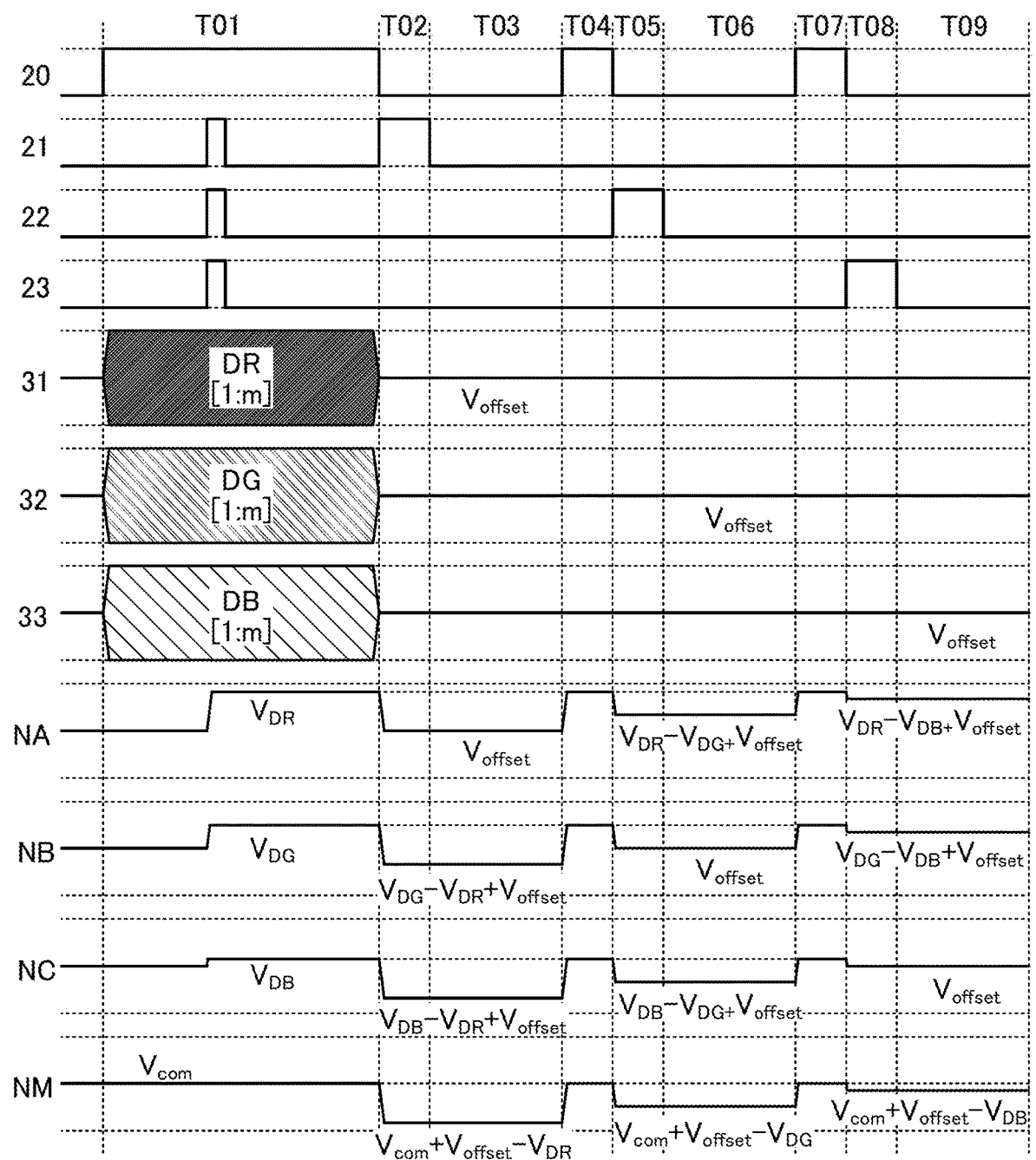
FIG. 3 A timing chart illustrating an example of an operation method of a display device.

FIG. 3 is a timing chart illustrating an example of an operation method of the pixel 11 in each period illustrated in FIG. 2. Here, the potential of the wiring 61 electrically connected to the other of the source and the drain of the transistor 40 is set to a potential $V_{com}$. The potential $V_{com}$ can be, for example, set to a ground potential. In addition, the capacitive coupling coefficient of the node NA, the capacitive coupling coefficient of the node NB, the capacitive coupling coefficient of the node NC, and the capacitive coupling coefficient of the node NM are set to 1. Note that in FIG. 3 and the like, the image data DR, the image data DG, and the image data DB which are written to the pixels 11 in any of first to m-th rows are referred to as image data DR[1:m], image data DG[1:m], and image data DB[1:m], respectively.

During the period T01, the image data DR, the image data DG, and the image data DB are written to the pixel 11. Specifically, potentials of the wiring 20 to the wiring 23 are set to high potentials, the image data DR is supplied to the pixel 11 through the wiring 31, the image data DG is supplied to the pixel 11 through the wiring 32, and the image data DB is supplied to the pixel 11 through the wiring 33. Accordingly, the transistor 40 to the transistor 43 are turned on, the potential of the node NA becomes a potential $V_{DR}$ corresponding to the image data DR, the potential of the node NB becomes a potential $V_{DG}$ corresponding to the image data DG, the potential of the node NC becomes a potential $V_{DB}$ corresponding to the image data DB, and the potential of the node NM becomes the potential $V_{com}$ that is the potential of the wiring 61. In other words, the image data DR is written to the memory circuit 15*a*, the image data DG is written to the memory circuit 15*b*, and the image data DB is written to the memory circuit 15*c*. Note that parallel writing of the image data DR, the image data DG, and the image data DB to the pixel 11 can be performed.

The image data DR, the image data DG, and the image data DB can be generated by the source driver 14. As described above, the transistor 40 is in a conduction state during the period T01. Thus, the source driver 14 can be regarded as having a function of generating the image data DR, the image data DG, and the image data DB in a period when the transistor 40 is in a conduction state.

In the pixel 11 where writing of the image data DR is completed, the potential of the wiring 21 is set to a low potential, whereby the potential $V_{DR}$ is held at the node NA. In the pixel 11 where writing of the image data DG is completed, the potential of the wiring 22 is set to a low potential, whereby the potential $V_{DG}$ is held at the node NB. In the pixel 11 where writing of the image data DB is completed, the potential of the wiring 23 is set to a low potential, whereby the potential $V_{DB}$ is held at the node NC. Accordingly, the image data DR, the image data DG, and the image data DB are retained in the memory circuit 15*a*, the memory circuit 15*b*, and the memory circuit 15*c*, respectively, included in the pixel 11.

In this specification and the like, the low potential can be a negative potential, for example. Alternatively, the low potential can be a ground potential, for example.

As shown in FIG. 2, the image data DR, the image data DG, and the image data DB are written to the pixels 11 from the first to the m-th row, row by row. In other words, the image data DR, the image data DG, and the image data DB are written in a line-sequential manner. Note that the period T01 can be regarded as a period from the start of writing image data to the pixel 11 in the first row to the end of writing image data to the pixel 11 in the m-th row.

In the case where the image data DR is written to a pixel 11[*i*] that is the pixel 11 in the i-th row (here i is an integer greater than or equal to 1 and less than or equal to m) during the period T01, the potential of the wiring 21 that is electrically connected to the pixel 11[i] is set to a high potential, and after the writing of the image data DR to the pixel 11[i] is completed, the potential of the wiring 21 that is electrically connected to the pixel 11[i] is set to a low potential. Furthermore, in the case where the image data DG is written to the pixel 11[i], the potential of the wiring 22 that is electrically connected to the pixel 11[i] is set to a high potential, and after the writing of the image data DG to the pixel 11[i] is completed, the potential of the wiring 22 that is electrically connected to the pixel 11[i] is set to a low potential. Furthermore, in the case where the image data DB is written to the pixel 11[i], the potential of the wiring 23 that is electrically connected to the pixel 11[i] is set to a high potential, and after the writing of the image data DB to the pixel 11[i] is completed, the potential of the wiring 23 that is electrically connected to the pixel 11[i] is set to a low potential. Meanwhile, the potential of the wiring 20 is set to a high potential from the start to the end of the period T01.

During the period T02, an offset potential that is a predetermined potential is generated by the source driver 14 and supplied to the node NA, whereby the image data DR retained in the memory circuit 15a is read. Specifically, the potentials of the wiring 21, the wiring 20, and the wiring 31 are set to a high potential, a low potential, and a potential $V_{offset}$ that is the offset potential, respectively. Accordingly, the transistor 41 is turned on, and the potential of the node NA becomes the potential $V_{offset}$. Here, since the transistor 40 is in a non-conduction state, the node NM is brought into a floating state. Thus, the potential of the node NM becomes "$V_{com}+V_{offset}-V_{DR}$". When the potential $V_{com}$ and the potential $V_{offset}$ are set to ground potentials, the potential of the node NM becomes "$-V_{DR}$". Thus, the potential corresponding to the image data DR is applied to the one electrode of the display unit 60, and the display unit 60 responds in accordance with the image data DR. For example, when the display unit 60 is a liquid crystal unit, light transmittance of the display unit 60 changes depending on the image data DR.

Through the above steps, the image data DR retained in the memory circuit 15a is read. In other words, the pixel 11 can be regarded as having a function of reading the image data DR from the memory circuit 15a when the offset potential is supplied to the memory circuit 15a.

Since the potentials of the wiring 22 and the wiring 23 are low potentials, the transistor 42 and the transistor 43 are in a non-conduction state. Thus, the node NB and the node NC as well as the node NM are in a floating state, and the potentials of the node NB and the node NC change depending on a change in the potential of the node NM. Specifically, the potential of the node NB becomes "$V_{DG}-V_{DR}+V_{offset}$", and the potential of the node NC becomes "$V_{DB}-V_{DR}+V_{offset}$". Here, when the potential $V_{offset}$ is a ground potential, the potential of the node NB becomes "$V_{DG}-V_{DR}$", and the potential of the node NC becomes "$V_{DB}-V_{DR}$". In other words, the potential difference between the node NB and the node NM and the potential difference between the node NC and the node NM are maintained before and after a change in the potential of the node NM.

Here, in the period T02, the reading of the image data DR retained in the memory circuit 15a can be performed, for example, concurrently on all of the pixels 11, that is, performed in a frame-sequential manner.

After a latency of the response from the display unit 60, the potential of the wiring 21 is set low to turn off the transistor 41, so that the image (R) is displayed on the display portion 12. Here, as illustrated in FIG. 2, a period in which the image (R) is displayed on the display portion 12 is referred to as the period T03. For example, the red light source provided in the display device 10 emits light, whereby the image (R) corresponding to the image data DR can be displayed.

In the period T04, the potential of the node NM is reset. Specifically, the potential of the wiring 20 is set high to turn the transistor 40 on, so that the potential of the node NM becomes the potential $V_{com}$. Accordingly, the potential of the node NM is reset.

Note that since the potentials of the wiring 21 to the wiring 23 are low potentials, the transistor 41 to the transistor 43 are in a non-conduction state. Accordingly, the node NA, the node NB, and the node NC are in a floating state; the potential of the node NA, the potential of the node NB, and the potential of the node NC change depending on a change in the potential of the node NM. Specifically, the potential of the node NA becomes the potential $V_{DR}$, the potential of the node NB becomes the potential $V_{DG}$, and the potential of the node NC becomes the potential $V_{DB}$. In other words, before and after the change in the potential of the node NM, the potential difference between the node NA and the node NM, the potential difference between the node NB and the node NM, and the potential difference between the node NC and the node NM are maintained.

In addition, the reset of the potential of the node NM can be performed, for example, concurrently on all of the pixels 11, that is, performed in a frame-sequential manner, in the period T04.

The offset potential is generated by the source driver 14 and supplied to the node NB in the period T05, whereby the image data DG retained in the memory circuit 15b is read. Specifically, the potentials of the wiring 22, the wiring 20, and the wiring 32 are set to a high potential, a low potential, and the potential $V_{offset}$, respectively. Accordingly, the transistor 42 is turned on, and the potential of the node NB becomes the potential $V_{offset}$. Here, the transistor 40 is turned off, so that the node NM is brought into a floating state. Thus, the potential of the node NM becomes "$V_{com}+V_{offset}-V_{DG}$". When the potential $V_{com}$ and the potential $V_{offset}$ are each a ground potential, the potential of the node NM is "$-V_{DG}$". Accordingly, a potential corresponding to the image data DG is applied to the one electrode of the display unit 60, and thus the display unit 60 responds in accordance with the image data DG.

Through the above steps, the image data DG retained in the memory circuit 15b is read. That is, the pixel 11 can be regarded as having a function of reading the image data DG from the memory circuit 15b when the offset potential is supplied to the memory circuit 15b.

Note that since the potentials of the wiring 21 and the wiring 23 are low potentials, the transistor 41 and the transistor 43 are in a non-conduction state. Thus, the node NA and the node NC as well as the node NM are in a floating state, and the potential of the node NA and the potential of the node NC change depending on a change in the potential of the node NM. Specifically, the potential of the node NA becomes "$V_{DR}-V_{DG}+V_{offset}$", and the potential of the NC becomes "$V_{DB}-V_{DG}+V_{offset}$". Here, when the potential $V_{offset}$ is set to a ground potential, the potential of the node NA becomes "$V_{DR}-V_{DG}$", and the potential of the node NC becomes "$V_{DB}-V_{DG}$". In other words, between before and after the change in the potential of the node NM, the potential difference between the node NA and the node NM and the potential difference between node NC and the node NM are maintained.

The reading of the image data DG retained in the memory circuit 15b can be performed, for example, concurrently on all of the pixels 11, that is, performed in a frame-sequential manner, in the period T05.

After a latency of the response from the display unit 60, the potential of the wiring 22 is set to a low potential to turn off the transistor 42, so that the image (G) is displayed on the display portion 12. Here, as illustrated in FIG. 2, a period in which the image (G) is displayed on the display portion 12 is referred to as the period T06. For example, the green light source provided in the display device 10 emits light, whereby the image (G) corresponding to the image data DG can be displayed.

In the period T07, the potential of the node NM is reset in a manner similar to that in the period T04.

In the period T08, the offset potential is supplied to the node NC, whereby the image data DB retained in the memory circuit 15c is read. Specifically, the potentials of the wiring 23, the wiring 20, and the wiring 33 are to a high potential, a low potential, and the potential $V_{offset}$, respectively. Accordingly, the transistor 43 is turned on, and the potential of the node NC becomes the potential $V_{offset}$. Here, the transistor 40 is turned off, so that the node NM is brought into a floating state. Thus, the potential of the node NM becomes "$V_{com}+V_{offset}-V_{DB}$". When the potential $V_{com}$ and the potential $V_{offset}$ are set to ground potentials, the potential of the node NM is "$-V_{DB}$". Accordingly, a potential corresponding to the image data DB is applied to the one electrode of the display unit 60, and thus the display unit 60 responds in accordance with the image data DB.

Through the above steps, the image data DB retained in the memory circuit 15c is read. In other words, the pixel 11 can be regarded as having a function of reading the image data DB from the memory circuit 15c when the offset potential is supplied to the memory circuit 15c.

Note that since the potentials of the wiring 21 and the wiring 22 are low potentials, the transistor 41 and the transistor 42 are in a non-conduction state. Thus, the node NA and the node NB as well as the node NM are in a floating state; the potentials of the node NA and the node NB change depending on a change in the potential of the node NM. Specifically, the potential of the node NA becomes "$V_{DR}-V_{DB}+V_{offset}$", and the potential of the node NB becomes "$V_{DG}-V_{DB}+V_{offset}$". Here, when the potential $V_{offset}$ is a ground potential, the potential of the node NA becomes "$V_{DR}-V_{DB}$", and the potential of the node NB becomes "$V_{DG}-V_{DB}$". In other words, between before and after the change in the potential of the node NM, the potential difference between the node NA and the node NM and the potential difference between node NB and the node NM are maintained.

The reading of the image data DB retained in the memory circuit 15c can be, for example, performed concurrently on all of the pixels 11, that is, performed in a frame-sequential manner, in the period T08.

After a latency of the response from the display unit 60, the potential of the wiring 23 is set low, to turn off the transistor 43, so that the image (B) is displayed on the display portion 12. Here, as illustrated in FIG. 2, a period in which the image (B) is displayed on the display portion 12 is referred to as the period T09. For example, the blue light source provided in the display device 10 emits light, whereby the image (B) corresponding to the image data DB can be displayed.

The above is an example of the operation method of the display device 10. In the above operation method, the image data can be read in a frame-sequential manner in the period T02, the period T05, and the period T08. By this, even when an image is displayed without waiting until the display unit 60 completely responds after the image data is read, generation of display unevenness can be suppressed. Thus, the display device 10 can operate at high speed. In particular, when the display device 10 is a large-sized display device with a large number of pixels, the display device 10 can operate at high speed.

As described above, since the display device 10 operates at high speed, the frame frequency of the display device 10 can be increased even when display is performed by a field-sequential method. Thus, for example, occurrence of color break can be suppressed, which leads to an increase in the quality of an image displayed on the display device 10. Furthermore, since the periods for displaying images, i.e., the period T03, the period T06, and the period T09, can be made longer, an image seen by a user of the display device 10 can be made bright even when the intensity of light emitted from the light sources is low. In particular, when the display device 10 is a large-sized display device, the quality of an image displayed on the display device 10 can be improved, and an image seen by the user of the display device 10 can be made bright.

In addition, as described above, the writing of the image data DR to the pixel 11, the writing of the image data DG to the pixel 11, and the writing of the image data DB to the pixel 11 can be performed in a parallel way in the period T01. By this, the display device 10 can be made to operate at higher speed. Note that the writing of the image data DR to the pixel 11, the writing of the image data DG to the pixel 11, and the writing of the image data DB to the pixel 11 are not necessarily performed in a parallel way. In that case, any one or two of the wiring 31 to the wiring 33 can be omitted. For example, the wiring 32 and the wiring 33 are omitted, and each of the memory circuit 15a, the memory circuit 15b, and the memory circuit 15c can be electrically connected to the wiring 31.

In the case where a plurality of transistors 40 are provided in the display device 10, for example, potentials supplied to gates of all the transistors 40 are controlled in a parallel way. By this, reset of the node NM can be performed at high speed. Thus, the period T04 and the period T07 can be shortened, so that the display device 10 can operate at high speed.

Note that the source driver 14 can generate the potential $V_{offset}$ by in the period T02, the period T05, and the period T08. In addition, as described above, the transistor 40 is in a non-conduction state in the period T02, the period T05, and the period T08. Thus, the source driver 14 can be regarded as having a function of generating the potential $V_{offset}$ in a period when the transistor 40 is in a non-conduction state.

Although the image (R), the image (G), and the image (B) are displayed in this order in FIG. 2 and FIG. 3, the order of images to be displayed can be changed as appropriate. In addition, FIG. 2 and FIG. 3 show the case where the image (R), the image (G), and the image (B) are each displayed one time after the image data DR, the image data DG, and the image data DB are written to the pixel 11; however, one embodiment of the present invention is not limited thereto. For example, after the image (B) is displayed in the period T09, the potential of the node NM may be reset and the potential $V_{offset}$ may be supplied to the node NB, so that the image (G) is displayed again. In other words, the image (G) may be displayed two times, for example, after the image data DR, the image data DG, and the image data DB are written to the pixel 11 in the period T01. By this, for example, a time of displaying the image (G) can be made longer than a time of displaying the image (R) and a time of displaying the image (B), which enables an increase in the quality of an image to be displayed on the display device 10. Note that some of the image (R), the image (G), and the image (B) are not necessarily displayed.

Although FIG. 1 to FIG. 3 illustrate the case where the pixel 11 includes three memory circuits, the pixel 11 may have such a structure that two memory circuits are included, that four memory circuits are included, or that five or more memory circuits are included. For example, in the case where the display device 10 operates by a field-sequential method and has a function of displaying images of four colors including white or the like, in addition to red, blue, and green, the pixel 11 preferably includes four memory circuits. By increasing the number of memory circuits included in the pixel 11, the display device 10 can operate at higher speed.

The operation method shown in FIG. 2 and FIG. 3 can be applied to the case where the display device 10 performs display by a method other than a field-sequential method. In this case, each of the image data DR, the image data DG, and the image data DB shown in FIG. 2 can be image data representing all of a red image, a green image, and a blue image. Accordingly, the red image, the green image, and the blue image can be displayed in a parallel way in each of the period T03, the period T06, and the period T09. In other words, in each of the period T03, the period T06, and the period T09, a color image of one frame can be displayed.

Figure 4A:
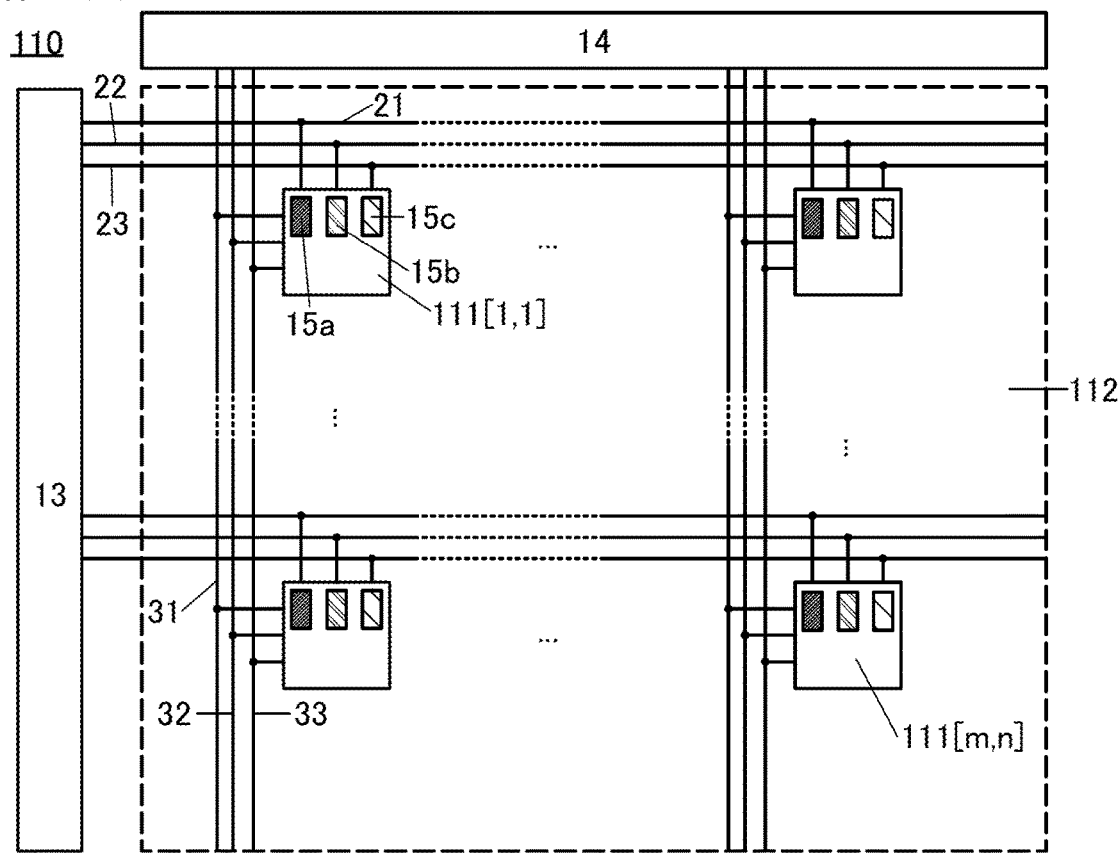
FIGS. 4 (A) and (B) are a block diagram illustrating a structure example of a display device and a circuit diagram illustrating a structure example of a pixel circuit, respectively.

FIG. 4 is a diagram illustrating a structure example of a display device 110 that the display device is one embodiment of the present invention. The display device 110 is a modification example of the display device 10 whose structure example is illustrated in FIG. 1(A).

The display device 110 includes a display portion 112 in which pixels 111 are arranged in a matrix of m rows and n columns, the gate driver 13, and the source driver 14. Like the pixel 11 included in the display device 10, each pixel 111 includes the memory circuit 15a, the memory circuit 15b, and the memory circuit 15c. Here, the transistor 40 is not provided outside the display portion 112.

The pixel 111 is electrically connected to the other pixels 111 in the same row through the wiring 21, is electrically connected to the other pixels 111 in the same row through the wiring 22, and is electrically connected to the other pixels 111 in the same row through the wiring 23. The pixel 111 is electrically connected to the other pixels 111 in the same column through the wiring 31, is electrically connected to the other pixels 111 in the same column through the wiring 32, and is electrically connected to another pixel 11 in the same column through the wiring 33.

Figure 4B:
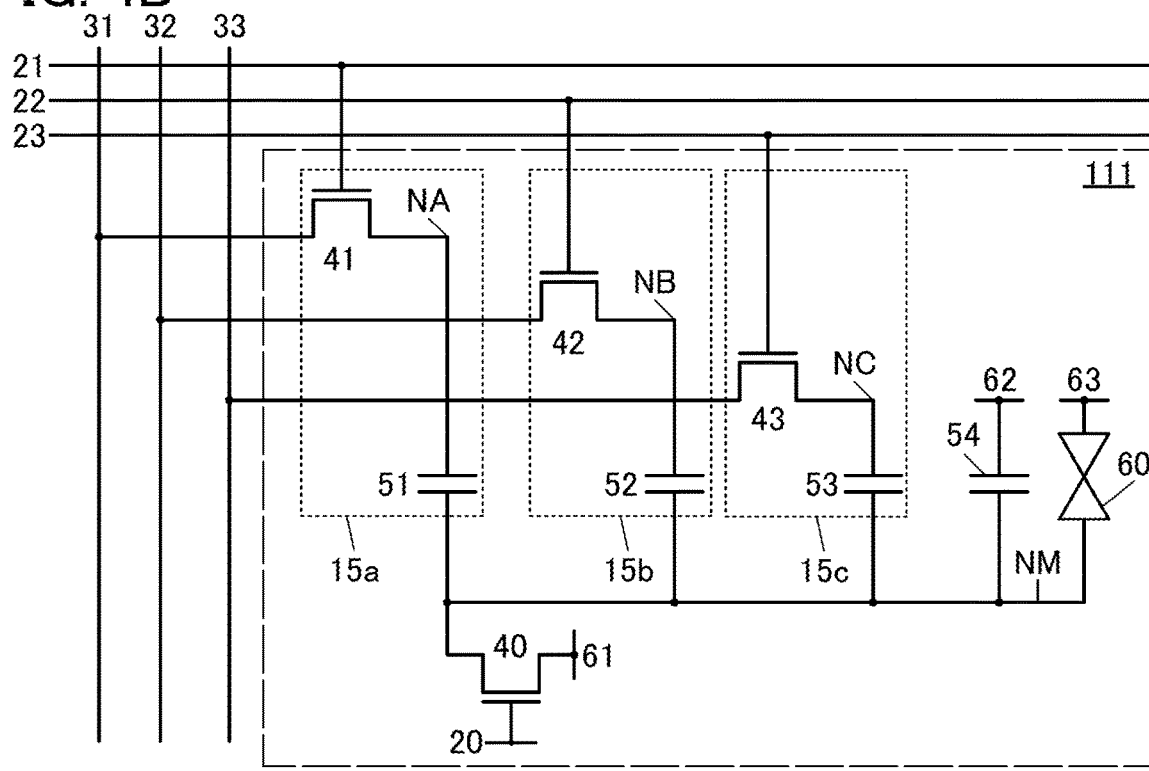

FIG. 4(B) is a circuit diagram illustrating a structure example of the pixel 111. The pixel 111 differs from the pixel 11 whose structure example is illustrated in FIG. 1(B) in that the transistor 40 is provided. Accordingly, the display device 110 differs from the display device 10 in that the transistor 40 is provided in the pixel.

A transistor with an extremely low off-state current, such as an OS transistor, is used as the transistor 40, whereby leakage of charges retained at the node NM can be extremely made small. Thus, the potential of the node NM can be held for a long time.

The on-state current of the OS transistor may be lower than that of a Si transistor. However, by providing the transistor 40 in the pixel, the potential of the node NM can be reset at high speed even when the on-state current of the transistor 40 is low, and thus the display device 110 can operate at high speed.

Note that the transistor 40 is not necessarily provided in all of the pixels 111. For example, the transistor 40 may be provided in one of the pixels 111 arranged in two rows and two columns. For example, the transistor 40 may be provided in one of the pixels 111 arranged in three rows and three columns. For example, the transistor 40 may be provided in one of the pixels 111 arranged in four rows and four columns. By reducing the number of the pixels 111 provided with the transistor 40, the aperture ratio of the pixels 111 per device can be increased.

Figure 5:
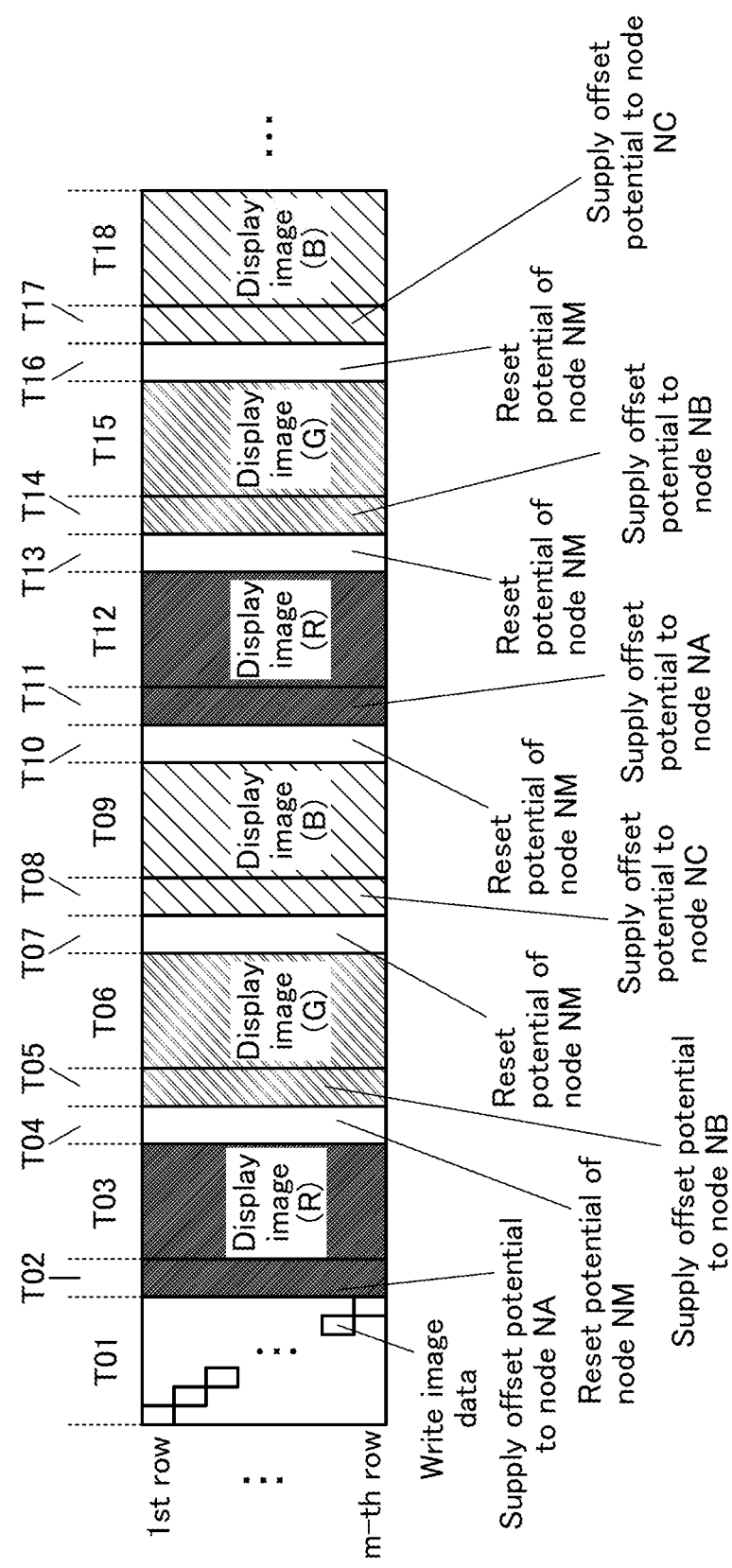
FIG. 5 A diagram illustrating an example of an operation method of a display device.

Next, an example of an operation method of the display device 110 in the case where the display device 110 performs display by a field-sequential method will be described. FIG. 5 is a diagram showing an operation example of the display device 110 displaying an image of one frame, which shows operation from a period T01 to a period T18.

Figure 6:
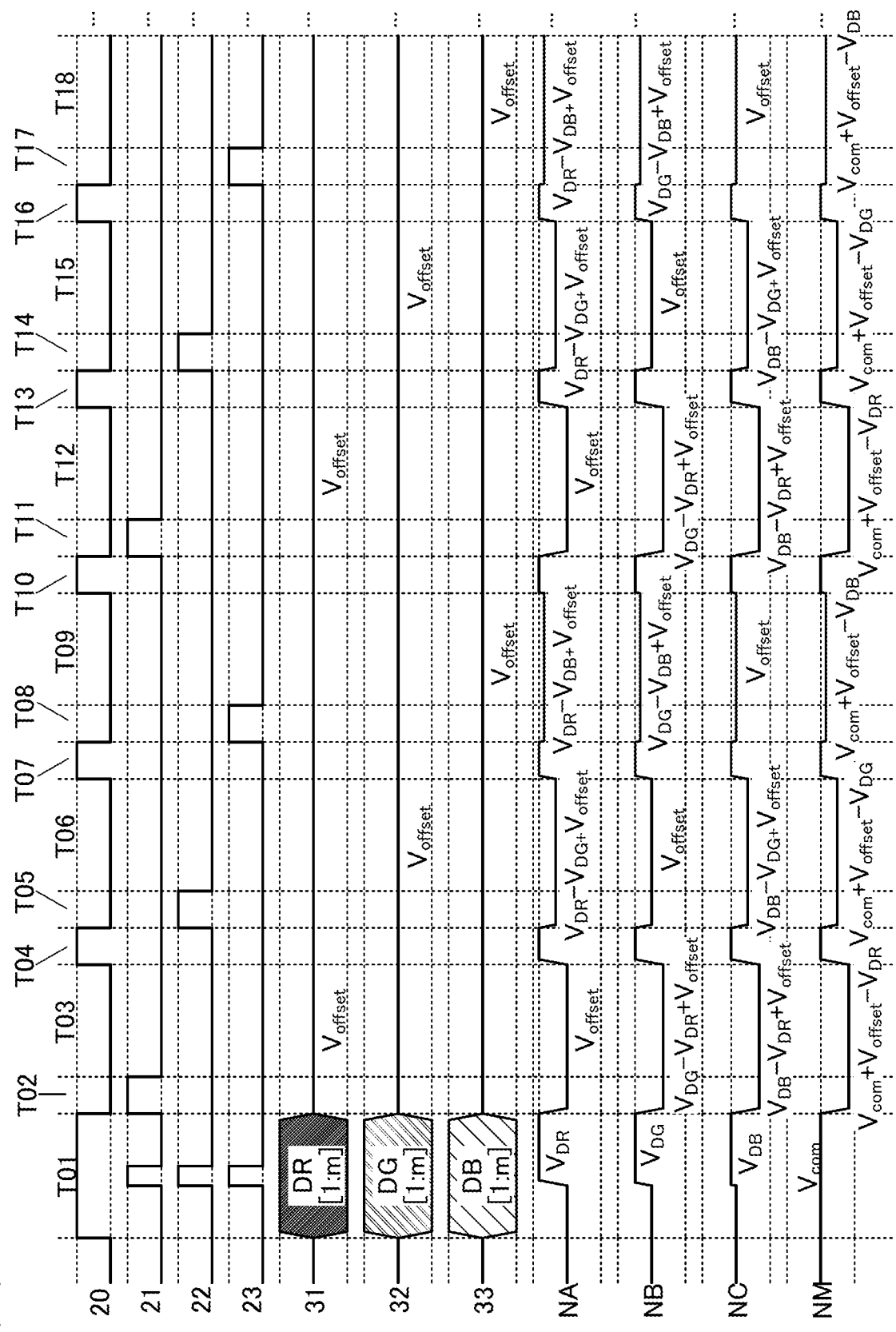
FIG. 6 A timing chart illustrating an example of an operation method of a display device.

FIG. 6 is a timing chart illustrating an example of an operation method of the pixel 111 in each period shown in FIG. 5. Here, as in the case shown in FIG. 3, the potential of the wiring 61 electrically connected to the other of the source and the drain of the transistor 40 is set to a potential $V_{com}$. In addition, the capacitive coupling coefficient of the node NA, the capacitive coupling coefficient of the node NB, the capacitive coupling coefficient of the node NC and that of the node NM are set to 1.

Operation from the period T01 to the period T09 are the same as that shown in FIG. 2 and FIG. 3. The potential of the node NM is reset in the period T10 in a manner similar to that in the period T04 or the like. From the period T11 to the period T18, operation similar to that in the period T02 to the period T09 is performed.

In other words, in the operation method shown in FIG. 5 and FIG. 6, the image data DR, the image data DG, and the image data DB are written to the pixel 111, and then, each of the image (R), the image (G), and the image (B) are displayed two times. Accordingly, the frequency of writing image data to the pixels 111 can be reduced, which leads to a reduction in power consumption of the display device 110. Note that after the image data DR, the image data DG, and the image data DB are written to the pixel 111, the image (R), the image (G), and the image (B) may be displayed three or more times. Accordingly, the frequency of writing image data to the pixels 111 can be further reduced, so that the power consumption of the display device 110 can be further reduced.

Note that although the image (R), the image (G), and the image (B) are displayed in this order in FIG. 5 and FIG. 6, the order of images to be displayed can be changed as appropriate as in the case shown in FIG. 2 and FIG. 3. Furthermore, the number of times of displaying the image (R), the number of times of displaying the image (G), and the number of times of displaying the image (B) are not necessarily the same each other. For example, the image (G) may be displayed not only after the image (R) is displayed but also after the image (B) is displayed.

As described above, the transistor 40 to the transistor 43 can be OS transistors with an extremely low off-state current, or the like. Thus, the potential of the node NM, the potential of the node NA, the potential of the node NB, and the potential of the node NC can be held for a long time. Therefore, even when the writing frequency of image data to the pixel 111 is reduced, a decrease in quality of an image to be displayed can be suppressed.

Figure 7:
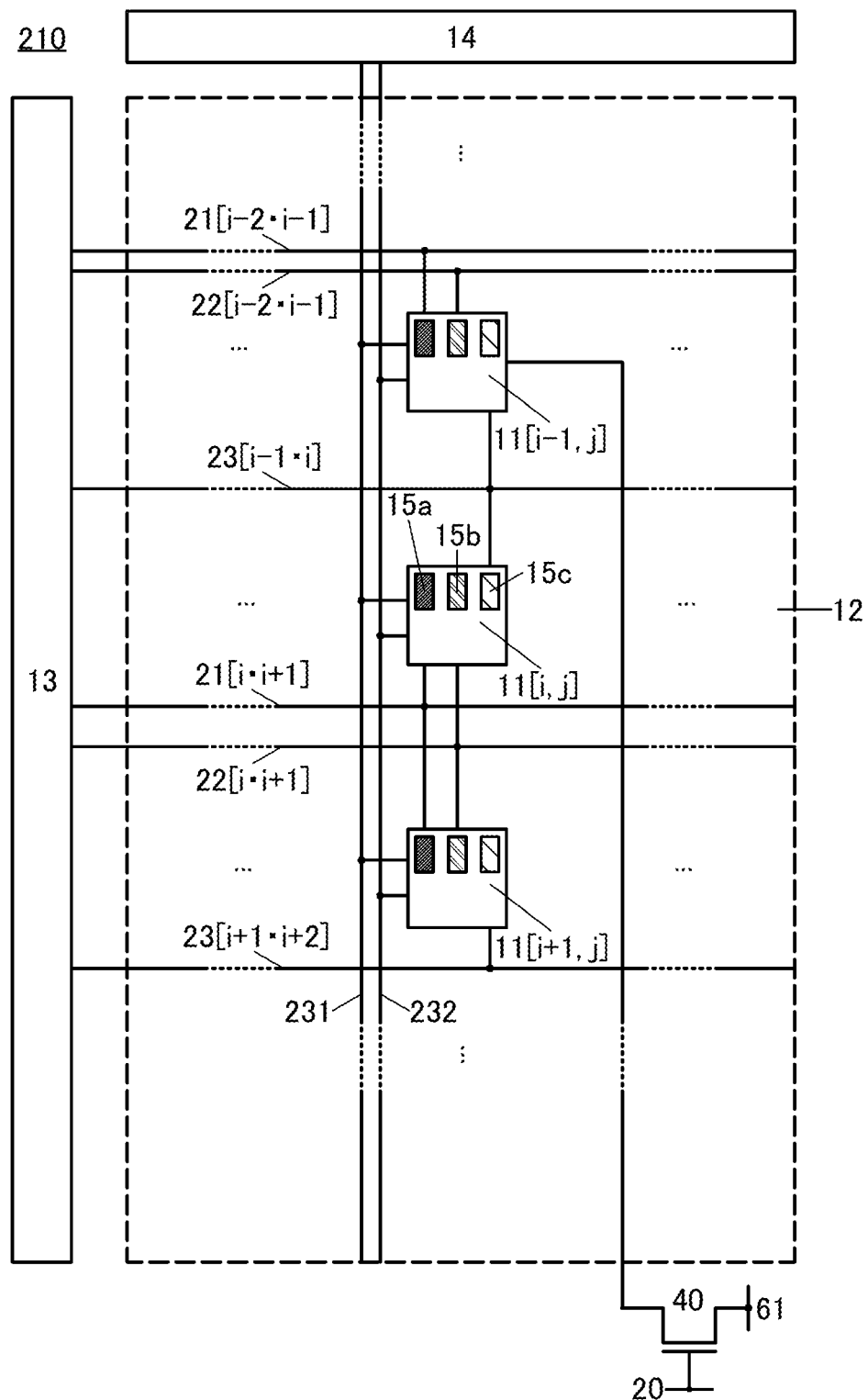
FIG. 7 A block diagram illustrating a structure example of a display device.

FIG. 7 is a diagram illustrating a structure example of a display device 210 that is the display device of one embodiment of the present invention. The display device 210 is a modification example of the display device 10 whose structure example is illustrated in FIG. 1(A).

Like the display device 10, the display device 210 includes the display portion 12 in which the pixels 11 are arranged in a matrix of m rows and n columns, the gate driver 13, the source driver 14, and the transistor 40. FIG. 7 illustrates a pixel 11[$i$−1,$j$] (here, i is an integer greater than or equal to 3 and less than or equal to m−2, and j is an integer greater than or equal to 1 and less than or equal to n), a pixel 11[$i$,$j$] and a pixel 11[$i$+1,$j$].

The pixel 11[$i$−1,$j$] and the pixel 11[$i$,$j$] are electrically connected to the same wiring 23. The pixel 11[$i$,$j$] and the pixel 11[$i$+1,$j$] are electrically connected to the same wiring 21 and the same wiring 22. Furthermore, a pixel 11[$i$−2,$j$] and the pixel 11[$i$−1,$j$] are electrically connected to the same wiring 21 and the same wiring 22, and the pixel 11[$i$+1,$j$] and a pixel 11[$i$+2,$j$] are electrically connected to the same wiring 23. Note that the pixel 11[$i$−2,$j$] and the pixel 11[$i$+2,$j$] are not illustrated in FIG. 7.

In the display device 210, one wiring 21, one wiring 22, and one wiring 23 are shared by the pixels 11 in two rows adjacent to each other. With this structure, the numbers of the wirings 21 to the wirings 23 functioning as scan lines can be each made smaller than m. Thus, the number of signals generated by the gate driver 13 can be reduced. Moreover, the aperture ratio of the pixel 11 can be increased.

In this specification and the like, for example, the wiring 21 shared by the pixels 11 in the i-th row and the pixels 11 in the (i+1)-th row is referred to as a wiring 21[$i$·$i$+1]. Note that the similar description applies to the wiring 22 and the wiring 23.

In the display device 210, one pixel 11 is electrically connected to the source driver 14 through a wiring 231 and a wiring 232 functioning as data lines. In other words, the number of wirings functioning as data lines electrically connected to one pixel 11 is smaller than the number of memory circuits included in one pixel 11. By reducing the number of wirings functioning as data lines, the aperture ratio of the pixel 11 can be increased.

Figure 8:
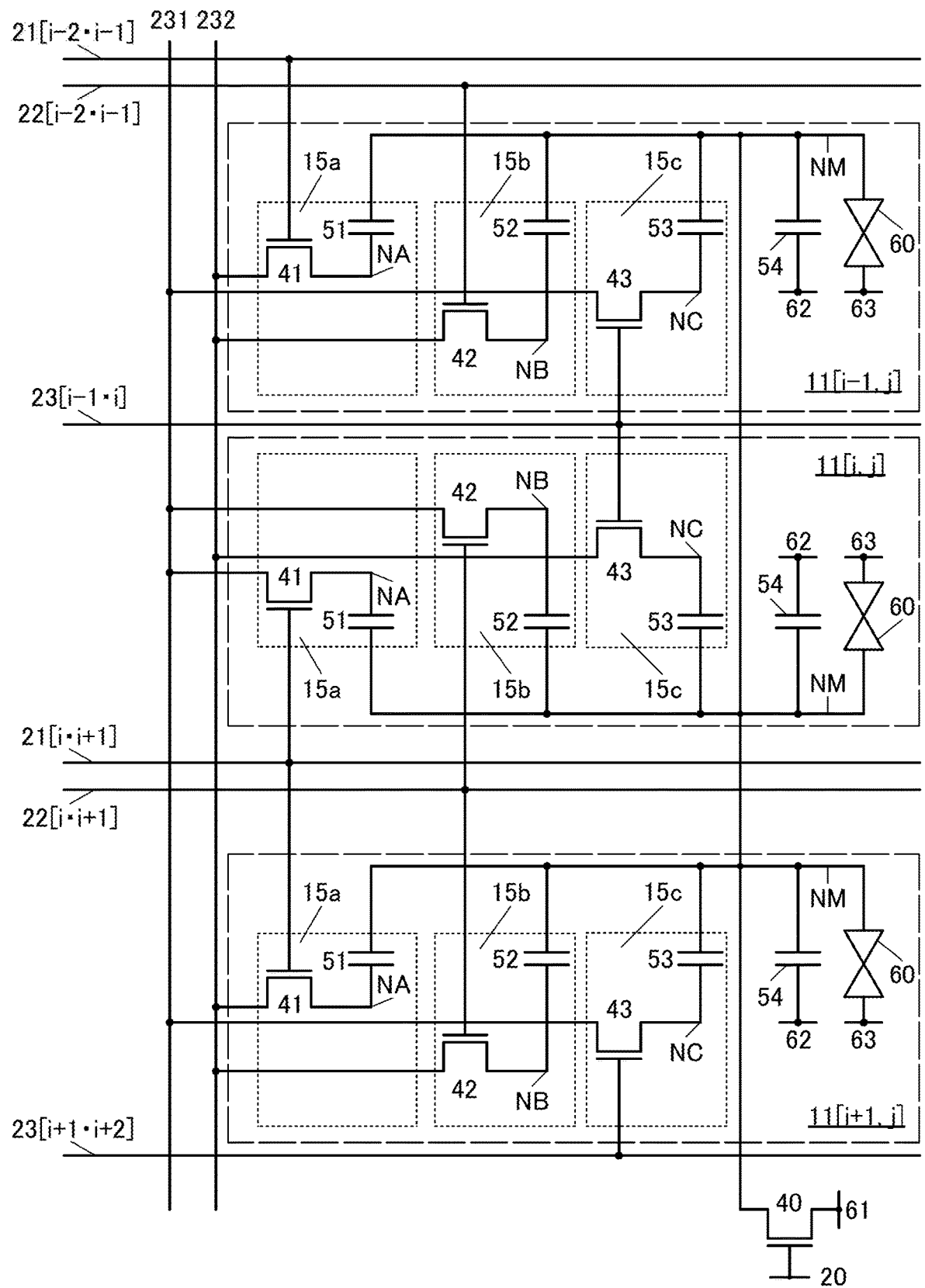
FIG. 8 A circuit diagram illustrating a structure example of a pixel circuit.

FIG. 8 is a circuit diagram illustrating structure examples of the pixel 11[$i$−1,$j$], the pixel 11[$i$,$j$], and the pixel 11[$i$+1,$j$] included in the display device 210. Note that FIG. 1(B) illustrates the transistor 40 as well as the pixel 11.

In the pixel 11[$i$−1,$j$], the other of the source and the drain of the transistor 41 is electrically connected to the wiring 232, the other of the source and the drain of the transistor 42 is electrically connected to the wiring 232, and the other of the source and the drain of the transistor 43 is electrically connected to the wiring 231. Furthermore, in the pixel 11[$i$−1,$j$], the gate of the transistor 41 is electrically connected to a wiring 21[$i$−2·$i$−1], the gate of the transistor 42 is electrically connected to a wiring 22[$i$−2·$i$−1], and the gate of the transistor 43 is electrically connected to a wiring 23 [$i$−1·$i$].

In the pixel 11[$i$,$j$], the other of the source and the drain of the transistor 41 is electrically connected to the wiring 231, the other of the source and the drain of the transistor 42 is electrically connected to the wiring 231, and the other of the source and the drain of the transistor 43 is electrically connected to the wiring 232. Furthermore, in the pixel 11[$i$,$j$], the gate of the transistor 41 is electrically connected to the wiring 21[$i$·$i$+1], the gate of the transistor 42 is electrically connected to a wiring 22[$i$·$i$+1], and the gate of the transistor 43 is electrically connected to the wiring 23[$i$−1·$i$].

In the pixel 11[$i$+1,$j$], the other of the source and the drain of the transistor 41 is electrically connected to the wiring 232, the other of the source and the drain of the transistor 42 is electrically connected to the wiring 232, and the other of the source and the drain of the transistor 43 is electrically connected to the wiring 231. Furthermore, in the pixel 11[$i$+1,$j$], the gate of the transistor 41 is electrically connected to the wiring 24[$i$·$i$+1], the gate of the transistor 42 is electrically connected to the wiring 22[$i$·$i$+1], and the gate of the transistor 43 is electrically connected to a wiring 23[$i$+1,$i$+2].

Next, an example of an operation method of the display device 210 in the case where the display device 210 performs display by a field-sequential method will be described. The display device 210 can be made to operate by a method similar to the operation method shown in FIG. 2.

Figure 9:
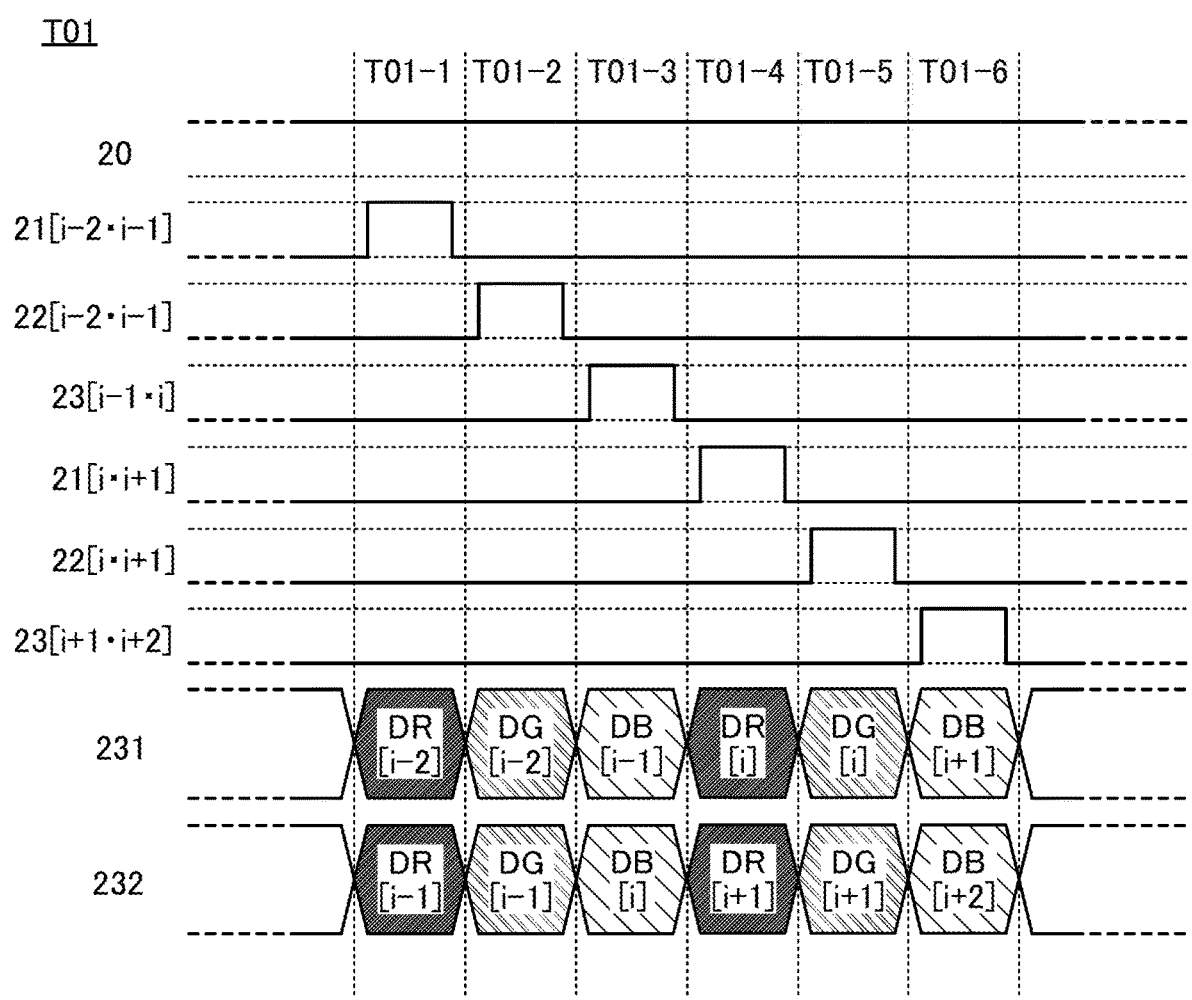
FIG. 9 A timing chart illustrating an example of an operation method of a display device.

FIG. 9 is a timing chart illustrating an example of an operation method of pixels 11[$i$−2] in the (i−2)-th row to pixels 11[$i$+2] in the (i+2)-th row in the period T01 shown in FIG. 2, which shows operation from a period T01-1 to a period T01-6.

In this specification and the like, for example, the image data DR, the image data DG, and the image data DB written to the pixels 11[$i$] are referred to as image data DR[i], image data DG[i], and image data DB[i], respectively. Note that the similar description applies to the image data DR, the image data DG, and the image data DB written to other pixels in some cases.

In the period T01-1, a potential of the wiring 21[$i$−2·$i$−1] is set to a high potential. In addition, a potential of the wiring 231 is set to a potential corresponding to image data DR[i−2], and a potential of the wiring 232 is set to a potential corresponding to image data DR[i−1]. Thus, the image data DR[i−2] is written to the memory circuit 15$a$ included in each pixel 11[$i$−2], and the image data DR[i−1] is written to the memory circuit 15$a$ included in each pixel 11[i−1]. When the writing of the image data DR[i−2] and the image data DR[i−1] is completed, the potential of the wiring 21[i−2·$i$−1] is set to a low potential.

In the period T01-2, a potential of the wiring 22[$i$−2·$i$−1] is set to a high potential. In addition, the potential of the wiring 231 is set to a potential corresponding to image data DG[i−2], and the potential of the wiring 232 is set to a potential corresponding to image data DG[i−1]. Thus, the image data DG[i−2] is written to the memory circuit 15$b$ included in each pixel 11[$i$−2], and the image data DG[i−1] is written to the memory circuit 15$b$ included in each pixel 11[$i$−1]. When the writing of the image data DG[i−2] and the image data DG[i−1] is completed, the potential of the wiring 22[$i$−2·$i$−1] is set to a low potential.

In the period T01-3, a potential of the wiring 23 [$i$−1·$i$] is set to a high potential. In addition, the potential of the wiring 231 is set to a potential corresponding to image data DB[i−1], and the potential of the wiring 232 is set to a potential corresponding to image data DB[i]. Thus, the image data DB[i−1] is written to the memory circuit 15$c$ included in each pixel 11[$i$], and the image data DB[i] is written to the memory circuit 15$c$ included in each pixel 11[$i$]. When the writing of the image data DB[i−1] and the image data DB[i] is completed, the potential of the wiring 23 [$i$·$i$+1] is set to a low potential.

In the period T01-4, a potential of the wiring 21[$i$·$i$+1] is set to a high potential. In addition, the potential of the wiring 231 is set to a potential corresponding to image data DR[i], and the potential of the wiring 232 is set to a potential corresponding to image data DR[i+1]. Thus, the image data DR[i] is written to the memory circuit 15a included in each pixel 11[i], and the image data DR[i+1] is written to the memory circuit 15a included in each pixel 11[i+1]. When the writing of the image data DR[i] and the image data DR[i+1] is completed, the potential of the wiring 21[i·i+1] is set to be a low potential.

In the period T01-5, a potential of the wiring 22 [i·i+1] is set to a high potential. In addition, the potential of the wiring 231 is set to a potential corresponding to image data DG[i], and the potential of the wiring 232 is set to a potential corresponding to image data DG[i+1]. Thus, the image data DG[i] is written to the memory circuit 15b included in each pixel 11[i], and the image data DG[i+1] is written to the memory circuit 15b included in each pixel 11[i+1]. When the writing of the image data DG[i] and the image data DG[i+1] is completed, the potential of the wiring 22 [i·i+1] is set to a low potential.

In the period T01-6, a potential of the wiring 23[i+1·i+2] is set to a high potential. In addition, the potential of the wiring 231 is set to a potential corresponding to image data DB[i+1], and the potential of the wiring 232 is set to a potential corresponding to image data DB[i+2]. Thus, the image data DB[i+1] is written to the memory circuit 15c included in each pixel 11[i+1], and the image data DB[i+2] is written to the memory circuit 15c included in each pixel 11[i+2]. When the writing of the image data DB[i+1] and the image data DB[i+2] is completed, the potential of the wiring 23[i+1·i+2] is set to a low potential.

The above is an example of the operation method of the pixels 11[i–2] to the pixels 11[i+2] in the (i+2)-th row. Note that the order of the image data written to the pixels 11 can be changed as appropriate. For example, in the period T01, after the image data DG[i–2] and the image data DG[i–1] are written to the pixels 11, the image data DR[i–2] and the image data DR[i–1] may be written to the pixels 11.

The operation from the period T02 to the period T09 can be similar to that shown in FIG. 3, other than setting both of the potentials of the wiring 231 and the wiring 232 to be the potential $V_{offset}$ in the period T02, the period T05, and the period T08. The operation method shown in FIG. 2, FIG. 3, and FIG. 9 can be applied also to the case where the display device 210 performs display by a method other than a field-sequential method.

Figure 10:
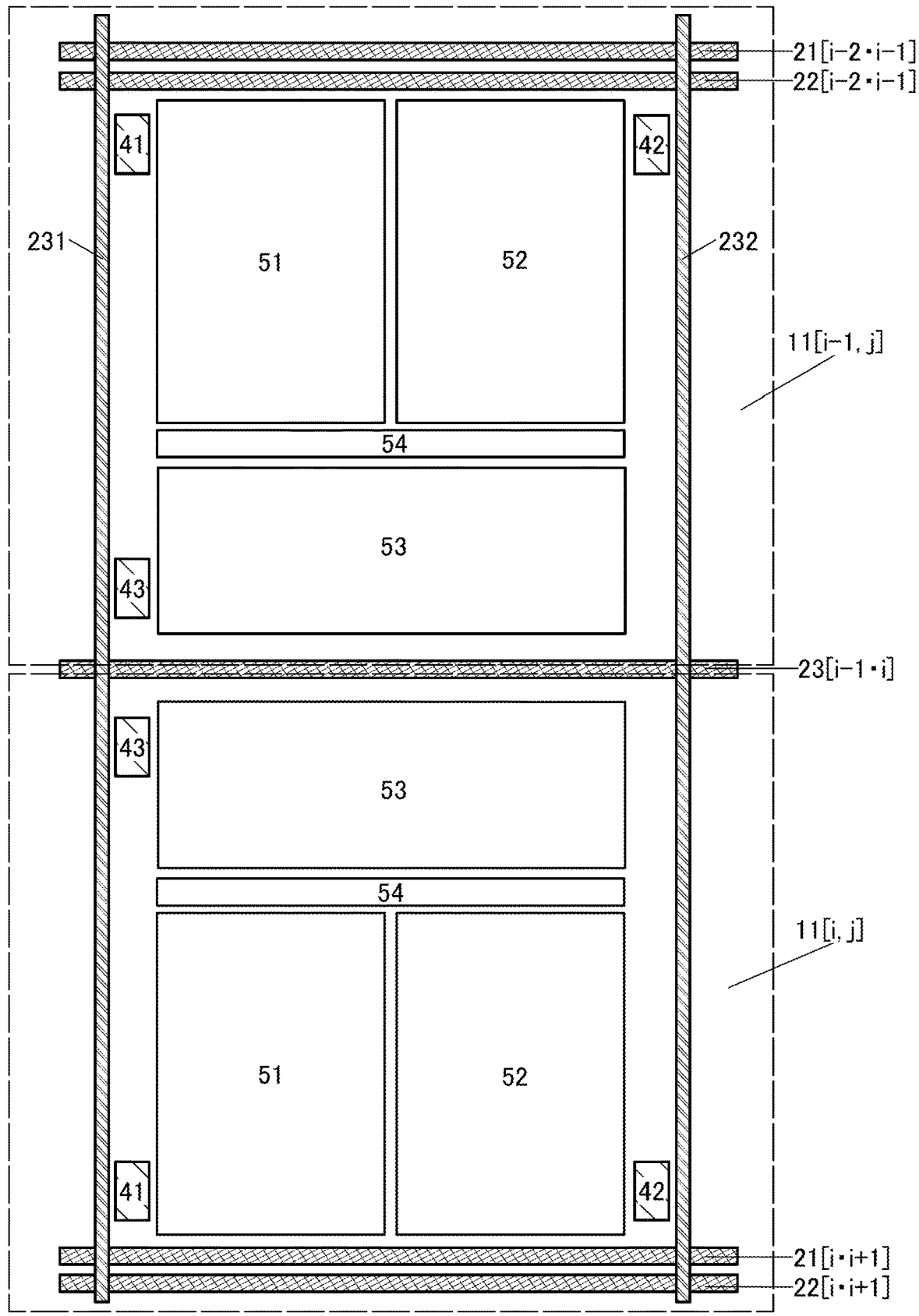
FIG. 10 A block top view illustrating a structure example of a display device.

FIG. 10 is a block top view illustrating structure examples of the pixel 11[i–1,j] and the pixel 11[i,j] included in the display device 210. Specifically, FIG. 10 is the block top view illustrating an example of positions and areas of, in addition to the transistor 41 to the transistor 43 and the capacitor 51 to the capacitor 54, the wiring 21[i–2·i–1], the wiring 22[i–2·i–1], the wiring 23 [i–1·i], the wiring 21[i·i+1], the wiring 22 [i·i+1], the wiring 231, and the wiring 232.

The area occupied by the capacitor 51 is larger than the area occupied by the capacitor 54. The area occupied by the capacitor 52 is larger than the area occupied by the capacitor 54. The area occupied by the capacitor 53 is larger than the area occupied by the capacitor 54. Accordingly, the capacitance of the capacitor 51 can be higher than the capacitance of the capacitor 54, the capacitance of the capacitor 52 can be higher than the capacitance of the capacitor 54, and the capacitance of the capacitor 53 can be higher than the capacitance of the capacitor 54. Thus, the capacitive coupling coefficient of the node NM can be made close to 1; the image data retained in the memory circuit 15a, the image data retained in the memory circuit 15b, and the image data retained in the memory circuit 15c can be read with high accuracy.

The area occupied by the capacitor 51 to the capacitor 54 is larger than the area occupied by the transistor 41 to the transistor 43. Thus, when the capacitor 51 to the capacitor 54 have light-transmitting properties, the aperture ratio of the pixel 11 can be increased. Specifically, the aperture ratio of the pixel 11 can be 60% or more, 70% or more, or 75% or more. Note that conductive layers having light-transmitting properties are used for the one electrodes of the capacitor 51 to the capacitor 54 and the other electrodes of the capacitor 51 to the capacitor 54, whereby the capacitor 51 to the capacitor 54 can have light-transmitting properties.

Figure 11:
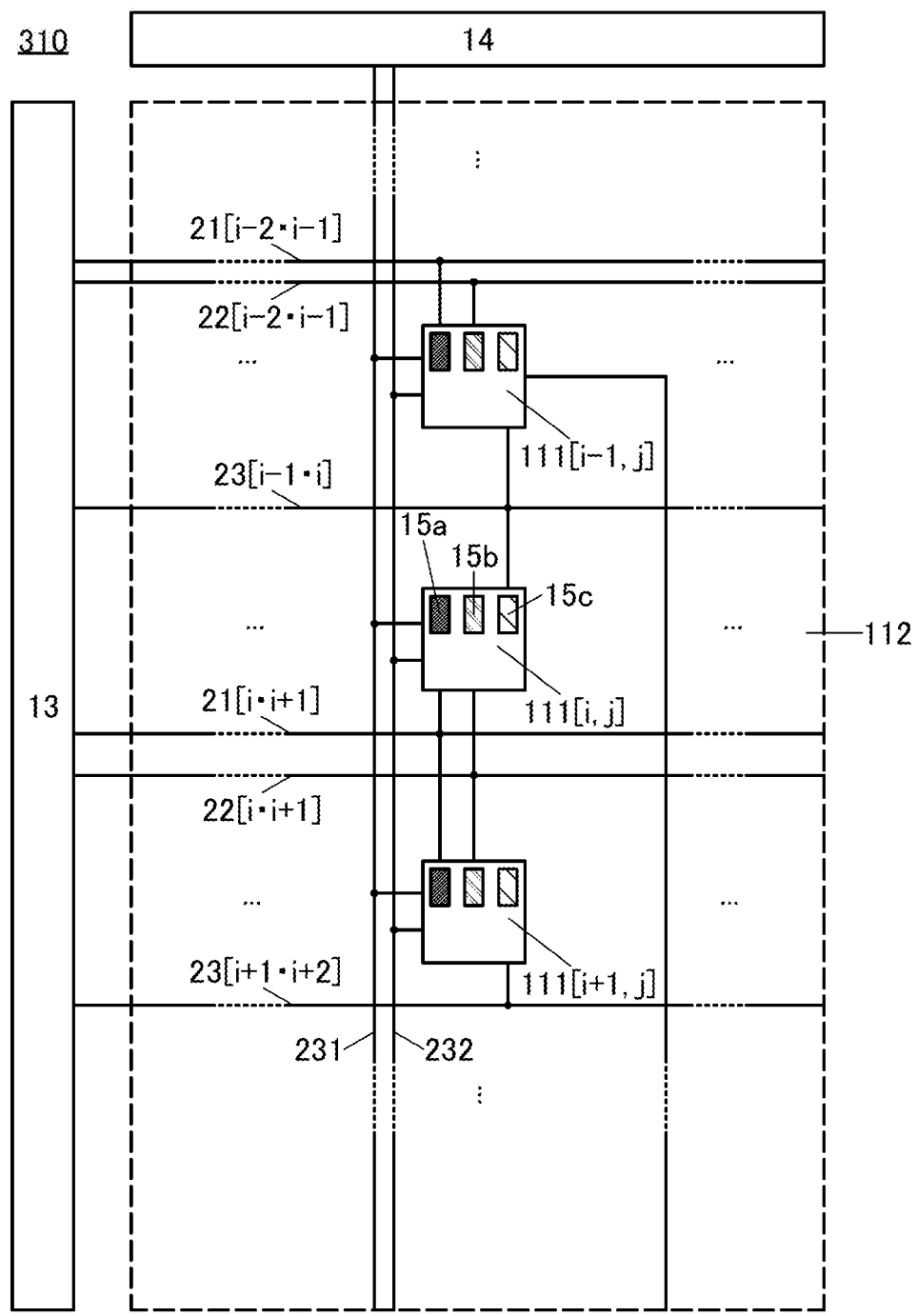
FIG. 11 A block diagram illustrating a structure example of a display device.

FIG. 11 is a diagram illustrating a structure example of a display device 310 that is the display device of one embodiment of the present invention. The display device 310 is a modification example of the display device 210 whose structure example is illustrated in FIG. 7 and is different from the display device 210 in that the display portion 112 where pixels 111 are arranged in a matrix is provided, instead of providing the display portion 12 where the pixels 11 are arranged in a matrix. In addition, a different point from the display device 210 is that the transistor 40 is not provided outside the display portion.

Figure 12:
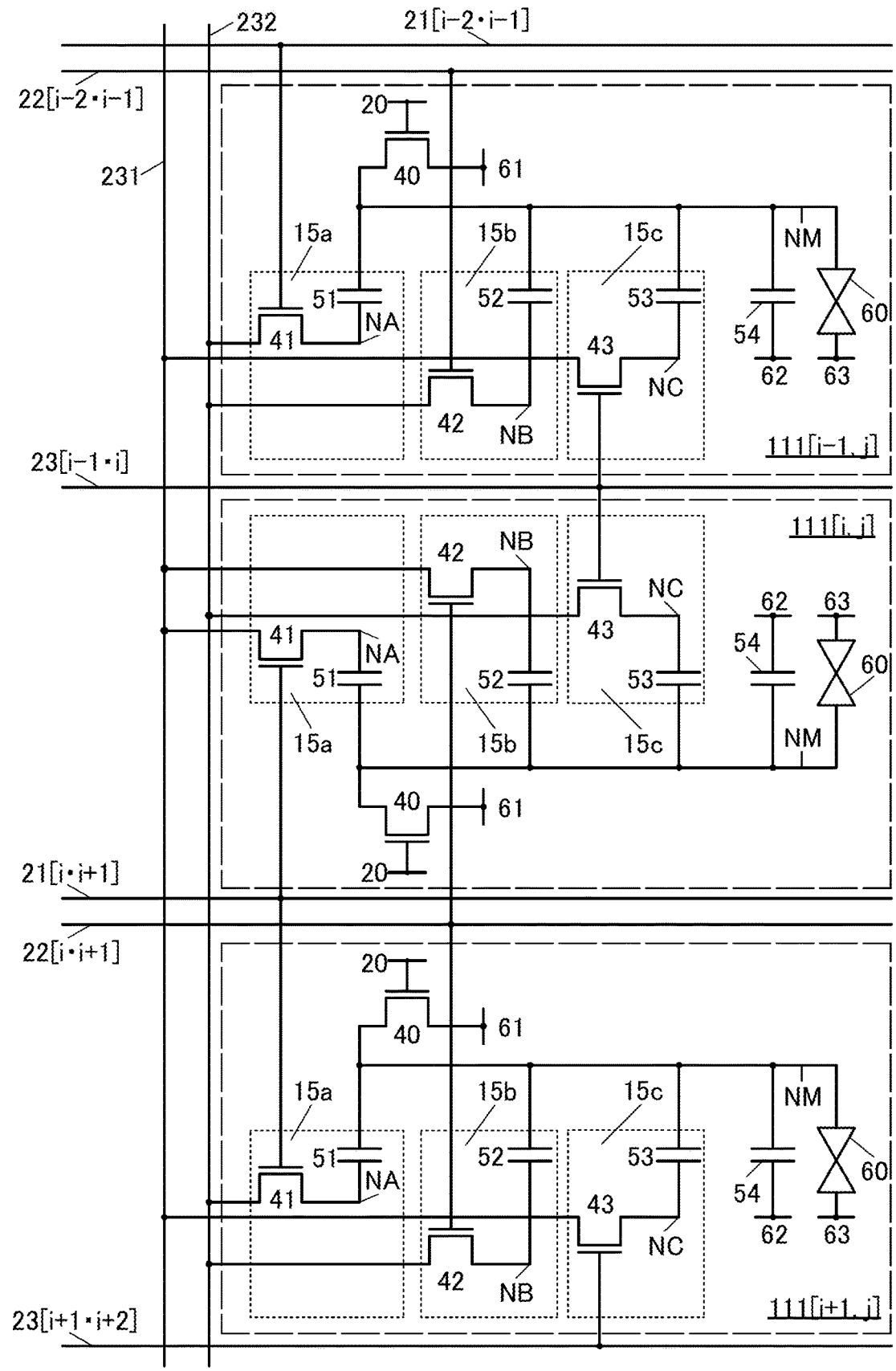
FIG. 12 A circuit diagram illustrating a structure example of a pixel circuit.

FIG. 12 is a circuit diagram illustrating structure examples of the pixel 111[i–1,j], the pixel 111[i,j], and the pixel 111[i+1,j] included in the display device 310. As described above, each pixel 111 is provided with the transistor 40.

Figure 13:
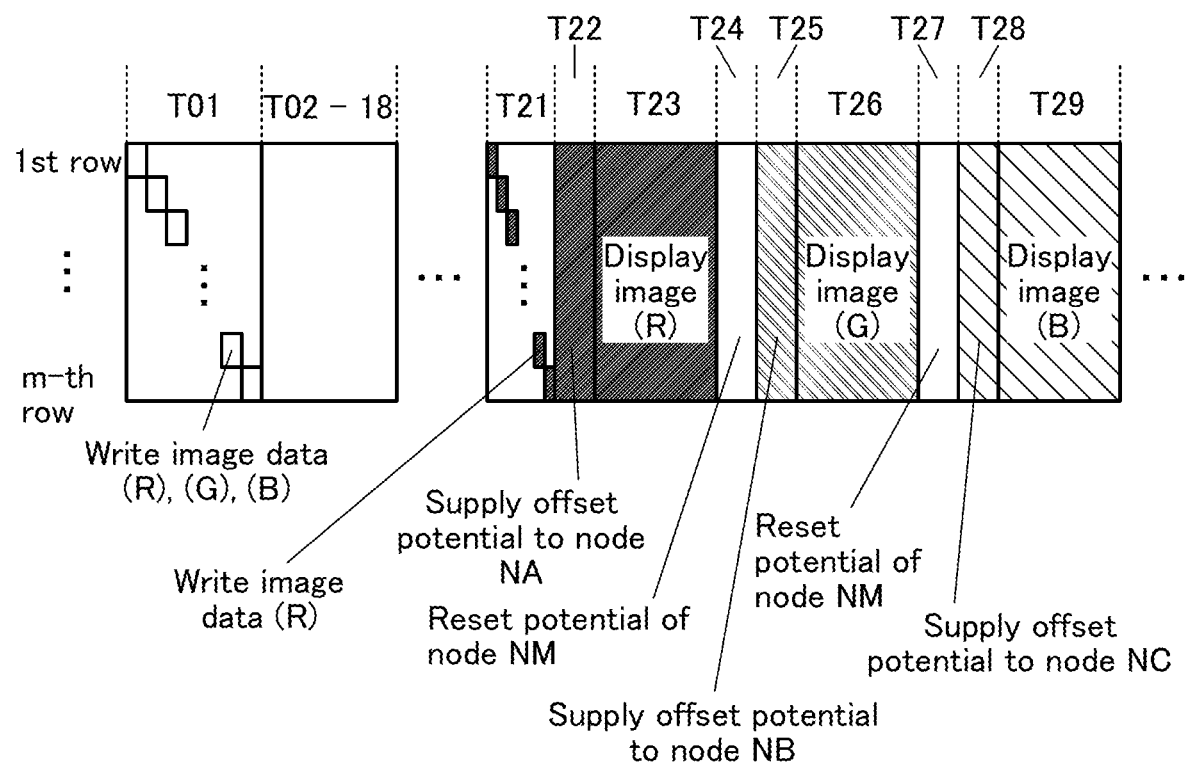
FIG. 13 A diagram illustrating an example of an operation method of a display device.

Next, an example of an operation method of the display device 310 in the case where the display device 310 performs display by a field-sequential method will be described. FIG. 13 is a diagram illustrating an example of the operation method of the display device 310, which shows operation from a period T01 to a period T29. FIG. 14 is a timing chart illustrating an example of an operation method of pixels 111[i–2] in the (i–2)-th row to pixels 111[i+2] in the (i+2)-th row in the period T01 and the period T21 shown in FIG. 13, which shows operation from a period T01-1 to a period T01-6 and operation from a period T21-1 to a period T21-2.

The operation in the period T01 is the same as that shown in FIG. 9. Operation from the period T02 to the period T18 is the same as that shown in FIG. 5 and FIG. 6. As in the case shown in FIG. 5 and FIG. 6, display of the image (R), display of the image (G), and display of the image (B) may be each performed three times after the image data DR, the image data DG, and the image data DB are written to the pixels 111 in the period T01.

In the period T21, the image data DR is written to the pixel 111. Specifically, in the period T21-1, the potential of the wiring 21[i–2·i–1] is set to a high potential. In addition, the potential of the wiring 231 is set to a potential corresponding to the image data DR[i–2], and the potential of the wiring 232 is set to a potential corresponding to the image data DR[i–1]. Thus, the image data DR[i–2] is written to the memory circuit 15a included in each pixel 111[i–2], and the image data DR[i–1] is written to the memory circuit 15a in each pixel 111[i–1]. When the writing of the image data DR[i–2] and the image data DR[i–1] is completed, the potential of the wiring 21[i–2·–1] is set to a low potential.

In the potential T21-2, the potential of the wiring 21[i·i+1] is set to a high potential. In addition, the potential of the wiring 231 is set to a potential corresponding to the image data DR[i], and the potential of the wiring 232 is set to a potential corresponding to the image data DR[i+1]. Thus, the image data DR[i] is written to the memory circuit 15a included in each pixel 111[i], and the image data DR[i+1] is written to the memory circuit 15a included in each pixel 111[i+1]. When the writing of the image data DR[i] and the image data DR[i+1] is completed, the potential of the wiring 21[·i+1] is set to a low potential.

Note that, in the period T21, only the image data DR is written to the pixels 111, and the writing of the image data DG to the pixels 111 and the writing of the image data DB to the pixels 111 are not performed. Thus, the period T21 is shorter than the period T01. The power consumption of the display device 310 in the period T21 is lower than that of the display device 310 in the period T01.

Operation similar to that from the period T02 to the period T09 is performed from the period T22 to the period T29. In other words, display of the image (R), display of the image (G), and display of the image (B) are performed. Note that display of the image (R), display of the image (G), and display of the image (B) may be each performed two or more times after the image data DR is written to the pixels 111 in the period T21.

As shown in FIG. 13 and FIG. 14, in the above display device 310, the frequency of writing the image data (R) to the pixels 111 can be higher than that of writing the image data (G) to the pixels 111 and that of writing the image data (B) to the pixels 111, for example. In the case where the illuminance change of red light is perceived by human eyes more easily than the illuminance changes of green light and blue light, a reduction in quality of images displayed on the display device 310 is notably recognized by a user of the display device 310, even when a change in the potential of the node NA is small. When the display device 310 is made to operate by a method shown in FIG. 13 and FIG. 14, a reduction in quality of images displayed on the display device 310 can be suppressed, and power consumption of the display device 310 can also be reduced. Thus, high-quality images can be displayed on the display device 310. Note that the frequency of writing the image data (G) to the pixels 111 may be made higher than the frequencies of writing the image data (R) and the image data (B) to the pixels 111. Alternatively, the frequency of writing the image data (B) to the pixels 111 may be made higher than the frequencies of writing the image data (R) and the image data (G) to the pixels 111.

For example, the frequency of writing image data corresponding to a high-luminance image among the image data (R), the image data (G), and the image data (B), to the pixels 111, may be made higher than the frequencies of writing the other image data to the pixels 111. Accordingly, the user of the display device 310 is less likely to recognize a change in the luminance of images displayed on the display device 310, and a reduction in quality of the images displayed on the display device 310 can be suppressed. Thus, high-quality images can be displayed on the display device 310. In addition, the power consumption of the display device 310 can be reduced as described above.

Note that although the image (R), the image (G), and the image (B) are displayed in this order in FIG. 13, the order of images to be displayed can be changed as appropriate as in the case shown in FIG. 5 or the like. Furthermore, the number of times of displaying the image (R), the number of times of displaying the image (G), and the number of times of displaying the image (B) are not necessarily the same each other.

This embodiment can be combined with the other embodiments as appropriate.

Embodiment 2

<Structure Example of Display Device>

In this embodiment, a display device of one embodiment of the present invention will be described with reference to drawings.

Figure 15A:
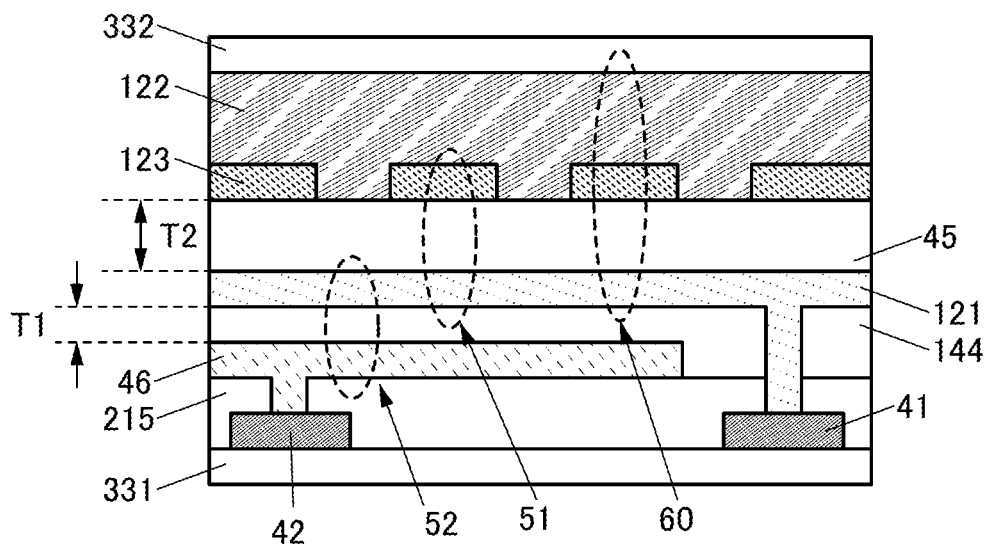
FIGS. 15 (A) and (B) are cross-sectional views each illustrating a structure example of a display device.

FIG. 15(A) shows a cross-sectional view of a transmissive liquid crystal display device. The liquid crystal display device illustrated in FIG. 15(A) includes a substrate 331, the transistor 41, the transistor 42, an insulating layer 215, a conductive layer 46, an insulating layer 144, a pixel electrode 121, an insulating layer 45, a common electrode 123, a liquid crystal layer 122, and a substrate 332.

The transistor 41 and the transistor 42 are positioned over the substrate 331. The insulating layer 215 is positioned over the transistor 41 and the transistor 42. The conductive layer 46 is positioned over the insulating layer 215. The insulating layer 144 is positioned over the transistor 41, the transistor 42, the insulating layer 215, and the conductive layer 46. The pixel electrode 121 is positioned over the insulating layer 144. The insulating layer 45 is positioned over the pixel electrode 121. The common electrode 123 is positioned over the insulating layer 45. The liquid crystal layer 122 is positioned over the common electrode 123. The common electrode 123 includes a region overlapping with the conductive layer 46 with the pixel electrode 121 positioned therebetween. The pixel electrode 121 is electrically connected to a source or a drain of the transistor 41. The conductive layer 46 is electrically connected to a source or a drain of the transistor 42. The conductive layer 46, the pixel electrode 121, and the common electrode 123 each have a function of transmitting visible light.

The liquid crystal display device of this embodiment has a structure in which the pixel electrode 121 and the common electrode 123 are stacked with the insulating layer 45 positioned therebetween, and operates in an FFS (Fringe Field Switching) mode. The pixel electrode 121, the liquid crystal layer 122, and the common electrode 123 can serve as the display unit 60.

The pixel electrode 121, the insulating layer 45, and the common electrode 123 can function as one capacitor 51. The conductive layer 46, the insulating layer 144, and the pixel electrode 121 can function as one capacitor 52. The liquid crystal display device in this embodiment thus includes two or more capacitors in a pixel.

The above capacitors each include a material transmitting visible light and a region where they overlap with each other. Accordingly, the pixel has a high aperture ratio and further can include a plurality of storage capacitors.

When the aperture ratio of the transmissive liquid crystal display device (also referred to as the aperture ratio of a pixel) is increased, a high-resolution liquid crystal display device can be obtained. Furthermore, a higher aperture ratio increases the light extraction efficiency. Thus, the power consumption of the liquid crystal display device can be reduced.

Figure 15B:
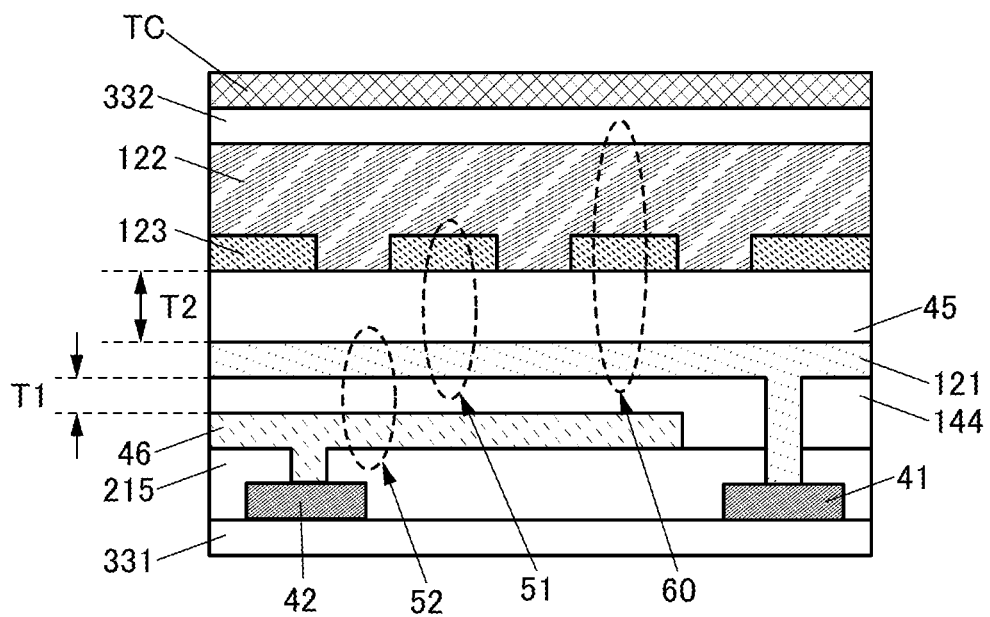

The structure of the display device of this embodiment can be used also for a touch panel. FIG. 15(B) illustrates an example of the display device in FIG. 15(A) including a touch sensor TC. The sensitivity of the touch sensor TC can be increased by providing the touch sensor TC on a position close to the display surface of the display device.

There is no particular limitation on a detection element (also referred to as a sensor element) included in the touch panel of one embodiment of the present invention. A variety of sensors such as a finger or a stylus that can sense proximity or touch of a sensing target can be used as the sensor element.

For example, a variety of types such as a capacitive type, a resistive type, a surface acoustic wave type, an infrared type, an optical type, and a pressure-sensitive type can be used as the sensor type.

Examples of the capacitive type include a surface capacitive type and a projected capacitive type. Examples of the projected capacitive type include a self-capacitive type and a mutual capacitive type. The use of a mutual capacitive type is preferable because multiple points can be sensed simultaneously.

The touch panel of one embodiment of the present invention can have any of a variety of structures, including a structure in which a display device and a sensor element that are separately formed are attached to each other and a structure in which an electrode and the like included in a sensor element are provided on one or both of a substrate supporting a display device and a counter substrate.

<<Cross-Sectional Structure of Display Device>>

Figure 16:
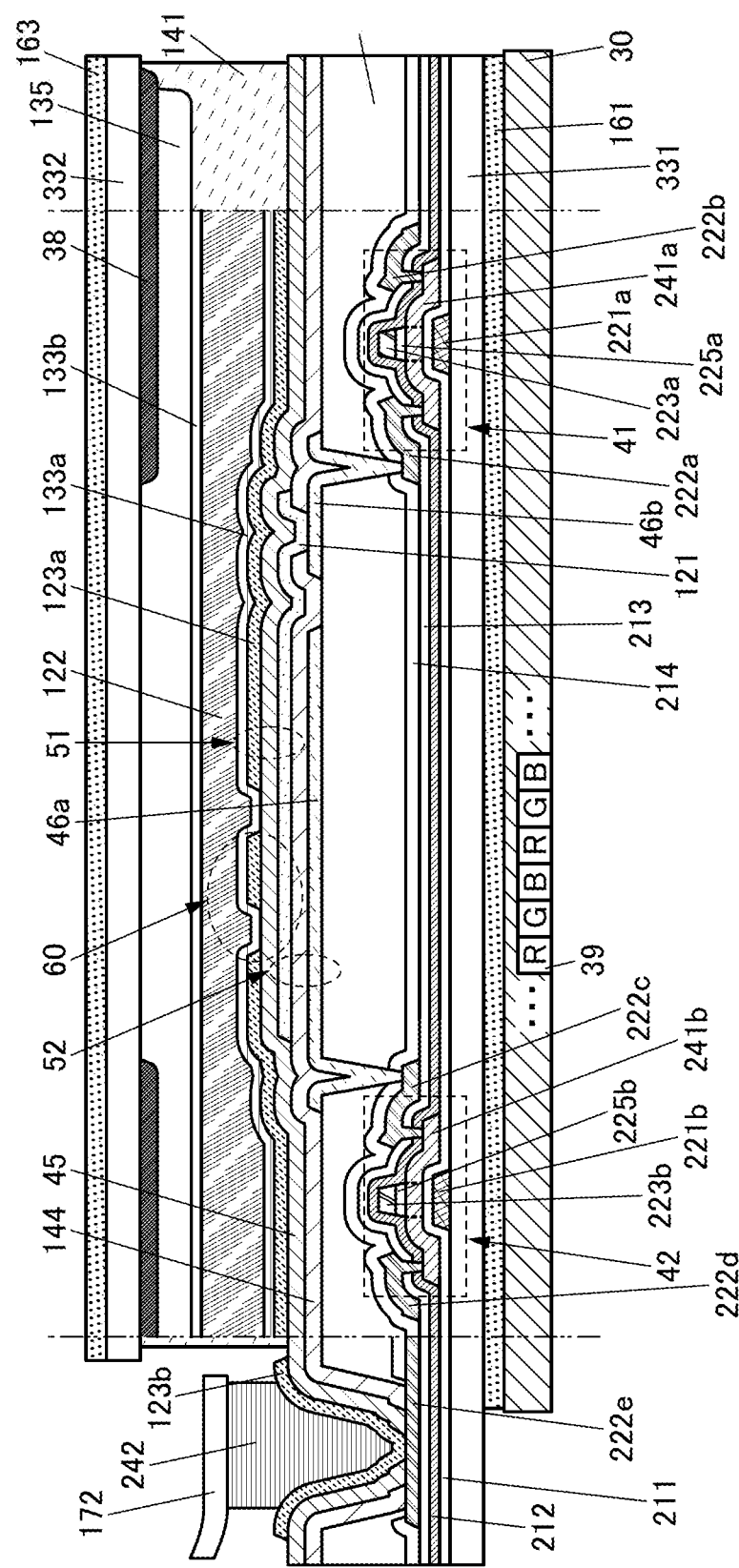
FIG. 16 A cross-sectional view illustrating a structure example of a display device.

FIG. 16 is a cross-sectional view of a display device. The display device illustrated in FIG. 16 includes the substrate 331, the substrate 332, the transistor 41, a conductive layer 46a, a conductive layer 46b, the insulating layer 144, the insulating layer 45, the pixel electrode 121, the liquid crystal layer 122, a common electrode 123a, a conductive layer 123b, a conductive layer 222e, an alignment film 133a, an alignment film 133b an adhesive layer 141, an overcoat 135, a light-blocking layer 38, a polarizing plate 161, a polarizing plate 163, a backlight unit 30, an FPC 172, and the like.

The transistor 41 and the transistor 42 are positioned over the substrate 331. The transistor 41 includes a gate 221a, a gate insulating layer 211, a semiconductor layer 241a, a conductive layer 222a, a conductive layer 222b, an insulating layer 212, an insulating layer 213, a gate insulating layer 225a, and a gate 223a. The transistor 42 includes a gate 221b, the gate insulating layer 211, a semiconductor layer 241b, a conductive layer 222c, a conductive layer 222d, the insulating layer 212, the insulating layer 213, a gate insulating layer 225b, and a gate 223b.

Each of the transistor 41 and the transistor 42 illustrated in FIG. 16 includes gates above and below a channel. It is preferable that the two gates be electrically connected to each other. A transistor with two gates that are electrically connected to each other can have a higher field-effect mobility and thus have higher on-state current than other transistors. Consequently, a circuit capable of high-speed operation can be obtained. Furthermore, the area occupied by a circuit portion can be reduced. The use of the transistor having a high on-state current can reduce signal delay in each wiring and can suppress display unevenness even in a display device in which the number of wirings is increased because of an increase in size or an increase in resolution. In addition, the area occupied by a circuit portion can be reduced, whereby the bezel of the display device can be narrowed. Moreover, with such a structure, a highly reliable transistor can be fabricated.

The semiconductor layer 241 includes a pair of low-resistance regions 241n and a channel formation region 241i sandwiched between the pair of low-resistance regions 241n.

The channel formation region 241i overlaps with the gate 221 with the gate insulating layer 211 provided therebetween, and overlaps with the gate 223 with the gate insulating layer 225 provided therebetween.

In this specification and the like, the semiconductor layer 241 indicates either one or both of the semiconductor layer 24a and the semiconductor layer 24b. The gate 221 indicates either one or both of the gate 22a and the gate 221b, and the gate 223 indicates either one or both of the gate 223a and the gate 223b. Furthermore, the gate insulating layer 225 indicates either one or both of the gate insulating layer 225a and the gate insulating layer 225b.

Here, an example in which a metal oxide is used for the semiconductor layer 241 is described.

The gate insulating layer 211 and the gate insulating layer 225 in contact with the channel formation region 241i are preferably oxide insulating layers. In the case where the gate insulating layer 211 or the gate insulating layer 225 has a stacked-layer structure, it is preferable that at least a layer in contact with the channel formation region 241i be the oxide insulating layer. Accordingly, generation of oxygen vacancies in the channel formation region 241i can be suppressed, and the reliability of the transistor can be improved.

Either one or both of the insulating layer 213 and an insulating layer 214 are preferably a nitride insulating layer. As a result, entry of impurities into the semiconductor layer 241 can be suppressed, and the reliability of the transistor can be improved.

The insulating layer 215 preferably has a planarization function, and is preferably an organic insulating layer, for example. Note that one or both of the insulating layer 214 and the insulating layer 215 are not necessarily formed.

The resistivity of the low-resistance regions 241n is lower than that of the channel formation region 241i. The low-resistance regions 241n are regions of the semiconductor layer 241 which are in contact with the insulating layer 212. Here, the insulating layer 212 preferably contains nitrogen or hydrogen. Accordingly, nitrogen or hydrogen in the insulating layer 212 enters the low-resistance regions 241n to increase the carrier concentration of the low-resistance regions 241n. Alternatively, the low-resistance regions 241n may be formed by the addition of an impurity with the gate 223 used as a mask. Examples of the impurity include hydrogen, helium, neon, argon, fluorine, nitrogen, phosphorus, arsenic, antimony, boron, and aluminum, and such an impurity can be added by an ion implantation method or an ion doping method. Other than the above impurities, for example, indium, which is a constituent element of the semiconductor layer 241, may be added to form the low-resistance regions 241n. The concentration of indium in the low-resistance region 241n is higher than that in the channel formation region 241i in some cases when indium is added.

Furthermore, after the gate insulating layer 225 and the gate 223 are formed, a first layer is formed to be in contact with part of a region of the semiconductor layer 241 and heat treatment is performed, whereby the resistance of the region can be reduced and the low-resistance regions 241n can be formed.

For the first layer, a film containing at least one of metal elements such as aluminum, titanium, tantalum, tungsten, chromium, and ruthenium can be used. In particular, the first layer preferably contains at least one of aluminum, titanium, tantalum, and tungsten. Alternatively, it is preferable to use a nitride containing at least one of these metal elements or an oxide containing at least one of these metal elements. In particular, it is preferable to use a metal film such as a tungsten film or a titanium film, a nitride film such as an aluminum titanium nitride film, a titanium nitride film, or an aluminum nitride film, or an oxide film such as an aluminum titanium oxide film, for example.

The thickness of the first layer can range, for example, from 0.5 nm to 20 nm, preferably from 0.5 nm to 15 nm, further preferably from 0.5 nm to 10 nm, still further preferably 1 nm to 6 nm. Typically, the thickness can be approximately 5 nm or approximately 2 nm. With such a thin first layer, the resistance of the semiconductor layer 241 can be sufficiently lowered.

It is important that the low-resistance regions 241n are made to have a higher carrier density than the channel formation region 241i. For example, the low-resistance regions 241n can be a region having a higher hydrogen content than the channel formation region 241i, or a region containing more oxygen vacancies than the channel formation region 241i. When bonded to a hydrogen atom, an oxygen vacancy in the oxide semiconductor functions as a carrier generation source.

The heat treatment is performed while the first layer is provided in contact with part of a region of the semiconductor layer 241, whereby oxygen in the region is absorbed into the first layer, and thus, a large amount of oxygen vacancies can be generated in the region. Thus, the low-resistance regions 241n can have extremely low resistance.

The low-resistance regions 241n formed in the above manner have a feature in that its resistance is not likely to be increased by subsequent process. There is no possibility that the conductivity of low-resistance regions 241n is impaired by heat treatment in an atmosphere containing oxygen or by deposition process in an atmosphere containing oxygen, for example; thus, a transistor with favorable electrical characteristics and high reliability can be fabricated.

When the first layer that has undergone the heat treatment has conductivity, the first layer is preferably removed after the heat treatment. In contrast, when the first layer has insulating properties, the first layer can function as a protective insulating film when remaining.

The conductive layer 46b is positioned over the insulating layer 215, the insulating layer 144 is positioned over the conductive layer 46b, and the pixel electrode 121 is positioned over the insulating layer 144. The pixel electrode 121 is electrically connected to the conductive layer 222a. Specifically, the conductive layer 222a is connected to the conductive layer 46b, and the conductive layer 46b is in connected to the pixel electrode 121.

The conductive layer 46a is positioned over the insulating layer 215. The conductive layer 46a is electrically connected to the conductive layer 222c. Specifically, the conductive layer 46a is in contact with the conductive layer 222c through an opening provided in the insulating layer 214 and the insulating layer 215.

The substrate 331 and the substrate 332 are attached to each other with the adhesive layer 141.

The FPC 172 is electrically connected to the conductive layer 222e. Specifically, the FPC 172 is in contact with a connector 242, the connector 242 is in contact with the conductive layer 123b, and the conductive layer 123b is in contact with the conductive layer 222e. The conductive layer 123b is formed over the insulating layer 45, and the conductive layer 222e is formed over the insulating layer 214. The conductive layer 123b can be formed using the same process and the same material as those for the common electrode 123a. The conductive layer 222e can be formed using the same process and the same material as those for the conductive layer 222a to the conductive layer 222d.

The pixel electrode 121, the insulating layer 45, and the common electrode 123a can function as one capacitor 51. The conductive layer 46a, the insulating layer 144, and the pixel electrode 121 can function as one capacitor 52. Thus, the display device of one embodiment of the present invention includes two or more capacitors in one pixel. As a result, the storage capacity of the pixel can be increased.

The two capacitors each include a material transmitting visible light and a region where they overlap with each other. Accordingly, the pixel can achieve high aperture ratio and high storage capacity.

Although FIG. 16 illustrates an example in which both the transistor 41 and the transistor 42 have a back gate (the gate 223), one or both of the transistor 41 and the transistor 42 do not necessarily have a back gate.

Figure 17:
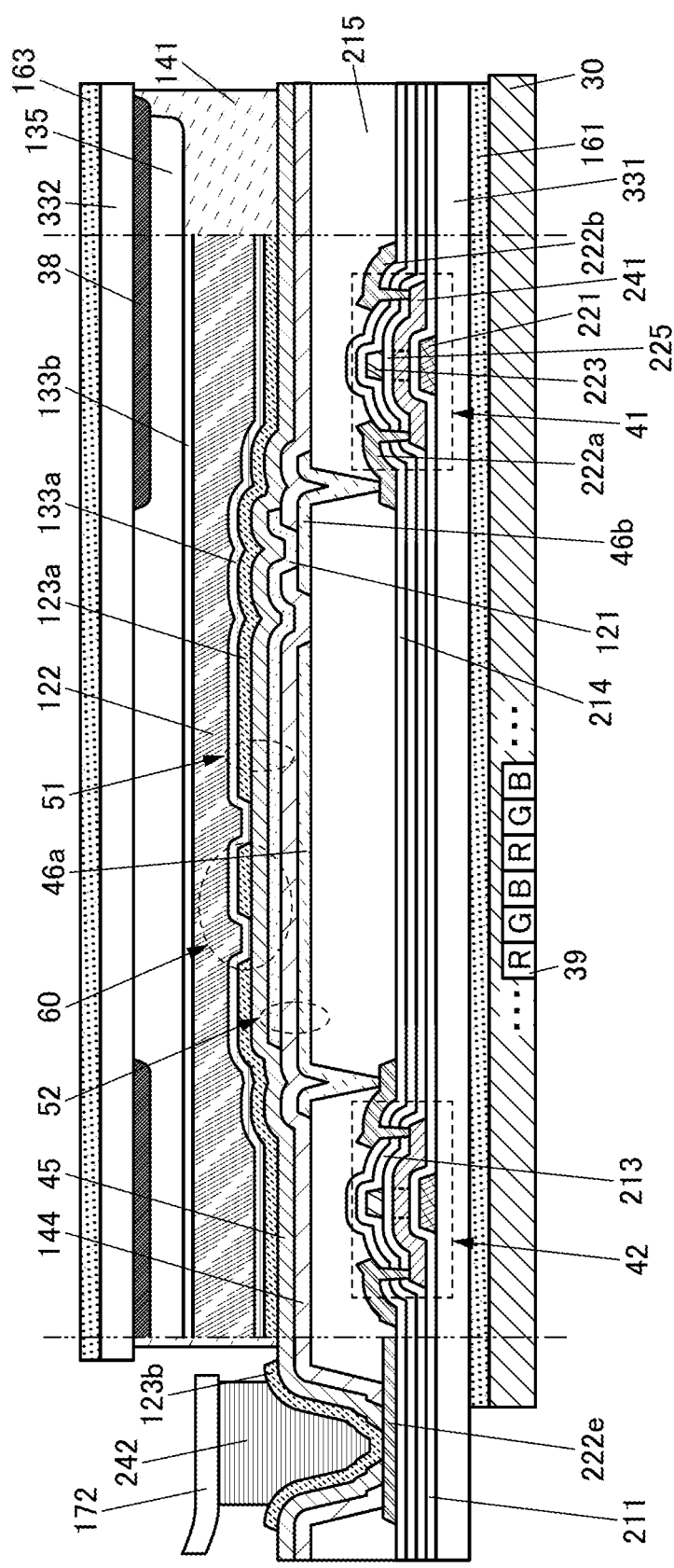
FIG. 17 A cross-sectional view illustrating a structure example of a display device.

Although FIG. 16 illustrates an example in which the gate insulating layer 225 is provided only over the channel formation region 241i and does not overlap with the low-resistance region 241n, the gate insulating layer 225 may overlap with at least part of the low-resistance region 241n. FIG. 17 illustrates an example in which the gate insulating layer 225 is formed to be in contact with the low-resistance region 241n and the gate insulating layer 211. The gate insulating layer 225 illustrated in FIG. 17 has an advantage in that the step of processing the gate insulating layer 225 with the gate 223 used as a mask is not necessary, the step height of a surface on which the insulating layer 214 is formed can be lowered, and the like.

Figure 18:
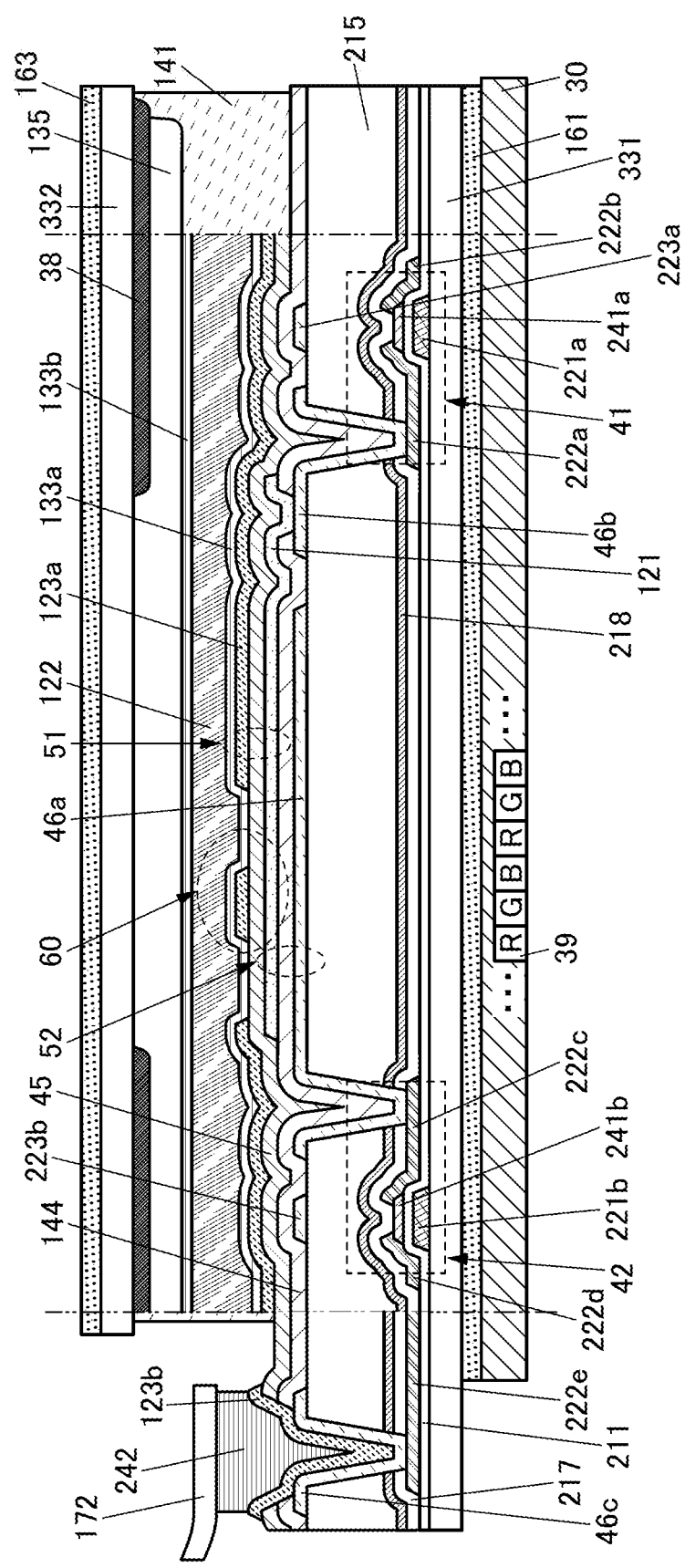
FIG. 18 A cross-sectional view illustrating a structure example of a display device.

The display device illustrated in FIG. 18 differs from the structures of the transistor 41 and the transistor 42 in FIG. 16 and FIG. 17.

The transistor 41 in FIG. 18 includes the gate 221a, the gate insulating layer 211, the semiconductor layer 241a, the conductive layer 222a, the conductive layer 222b, an insulating layer 217, an insulating layer 218, the insulating layer 215, and the gate 223a. The transistor 42 includes the gate 221b, the gate insulating layer 211, the semiconductor layer 241b, the conductive layer 222c, the conductive layer 222d, the insulating layer 217, the insulating layer 218, the insulating layer 215, and the gate 223b. One of the conductive layer 222a and the conductive layer 222b functions as a source and the other functions as a drain. The insulating layer 217, the insulating layer 218, and the insulating layer 215 function as gate insulating layers.

Here, an example in which a metal oxide is used for the semiconductor layer 241 is described.

The gate insulating layer 211 and the insulating layer 217 which are in contact with the semiconductor layer 241 are preferably oxide insulating layers. In the case where the gate insulating layer 211 or the insulating layer 217 has a stacked-layer structure, at least a layer in contact with the semiconductor layer 241 is preferably an oxide insulating layer. Accordingly, generation of oxygen vacancies in the semiconductor layer 241 can be suppressed, and thus, the reliability of the transistor can be improved.

The insulating layer 218 is preferably a nitride insulating layer. As a result, entry of impurities into the semiconductor layer 241 can be suppressed, and the reliability of the transistor can be improved.

The insulating layer 215 preferably has a planarization function, and is preferably an organic insulating layer, for example. Note that the insulating layer 215 is not necessarily formed, and the conductive layer 46a may be formed over and in contact with the insulating layer 218.

The conductive layer 46b is positioned over the insulating layer 215, the insulating layer 144 is positioned over the conductive layer 46b, and the pixel electrode 121 is positioned over the insulating layer 144. The pixel electrode 121 is electrically connected to the conductive layer 222a. Specifically, the conductive layer 222a is connected to the conductive layer 46b, and the conductive layer 46b is connected to the pixel electrode 121.

The conductive layer 46a is positioned over the insulating layer 215. The insulating layer 144 and the insulating layer 45 are positioned over the conductive layer 46a. The common electrode 123a is positioned over the insulating layer 45.

<<Material of Component>>

Next, the details of materials and the like that can be used for components of the display device of this embodiment will be described.

There are no strict limitation on the material or the like for a substrate included in the display device; a variety of substrates can be used. For example, a glass substrate, a quartz substrate, a sapphire substrate, a semiconductor substrate, a ceramic substrate, a metal substrate, a plastic substrate, or the like can be used.

The use of a thin substrate can reduce the weight and thickness of the display device. Furthermore, the use of a substrate that is thin enough to have flexibility allows a flexible display device to be obtained.

Liquid crystal materials include a positive liquid crystal material with a positive dielectric anisotropy ($\Delta\varepsilon$) and a negative liquid crystal material with a negative dielectric anisotropy. Either of the materials can be used in one embodiment of the present invention, and an optimal liquid crystal material can be used according to the employed mode and design.

The display device of this embodiment can employ a liquid crystal unit having a variety of modes. For example, other than the above-described FFS mode, an IPS mode, a TN mode, an ASM (Axially Symmetric aligned Micro-cell) mode, an OCB (Optically Compensated Birefringence) mode, an FLC (Ferroelectric Liquid Crystal) mode, an AFLC (AntiFerroelectric Liquid Crystal) mode, an ECB (Electrically Controlled Birefringence) mode, a VA-IPS mode, a guest-host mode, or the like can be used for a liquid crystal unit.

Note that the liquid crystal unit is a unit that controls the transmission or non-transmission of light utilizing an optical modulation action of a liquid crystal. The optical modulation action of the liquid crystal is controlled by an electric field applied to the liquid crystal (including a horizontal electric field, a vertical electric field, or an oblique electric field). As the liquid crystal used for the liquid crystal unit, thermotropic liquid crystal, low-molecular liquid crystal, high-molecular liquid crystal, polymer dispersed liquid crystal (PDLC), ferroelectric liquid crystal, antiferroelectric liquid crystal, or the like can be used. Such a liquid crystal material exhibits a cholesteric phase, a smectic phase, a cubic phase, a chiral nematic phase, an isotropic phase, or the like depending on conditions.

As described above, in the display device of this embodiment, a liquid crystal unit can be driven with application of high voltage; therefore, a liquid crystal exhibiting a blue phase may be used. The blue phase is one of liquid crystal phases, which is generated just before a cholesteric phase changes into an isotropic phase while the temperature of a cholesteric liquid crystal is increased. Since the blue phase appears only in a narrow temperature range, a liquid crystal composition in which a chiral material is mixed to account for 5 weight % or more is used for the liquid crystal layer in order to improve the temperature range. The liquid crystal composition that contains liquid crystal exhibiting a blue phase and a chiral material has a short response speed and exhibits optical isotropy. In addition, the liquid crystal composition containing a liquid crystal exhibiting a blue phase and a chiral material does not need alignment treatment and has small viewing angle dependence. Since an alignment film does not need to be provided and rubbing treatment is unnecessary, electrostatic discharge damage caused by the rubbing treatment can be prevented and defects or damage of the display panel in the manufacturing process can be reduced.

Since the display device of this embodiment is a transmissive liquid crystal display device, a visible-light-transmitting conductive material is used for both of a pair of electrodes (the pixel electrode 121 and the common electrode 123a). In addition, when the conductive layer 46b is formed using a conductive material that transmits visible light, a decrease in aperture ratio in a pixel can be suppressed even when the capacitor 52 is provided. Note that a silicon nitride film is preferable as the insulating layer 144 and the insulating layer 45 functioning as a dielectric of the capacitor.

For example, a material containing one or more kinds selected from indium (In), zinc (Zn), and tin (Sn) is preferably used as the conductive material transmitting visible light. Specifically, indium oxide, indium tin oxide (ITO), indium zinc oxide, indium oxide containing tungsten oxide, indium zinc oxide containing tungsten oxide, indium oxide containing titanium oxide, indium tin oxide containing titanium oxide, indium tin oxide containing silicon oxide (ITSO), zinc oxide, zinc oxide containing gallium, and the like are given. Note that a film containing graphene can be used as well. The film including graphene can be formed, for example, by reducing a film including graphene oxide.

A conductive film that transmits visible light can be formed using an oxide semiconductor (hereinafter also referred to as an oxide conductive layer). For example, the oxide conductive layer preferably includes indium and further preferably includes an In-M-Zn oxide (M is Al, Ti, Ga, Y, Zr, La, Ce, Nd, Sn, or Hf).

An oxide semiconductor is a semiconductor material whose resistance can be controlled by oxygen vacancies in the film and/or the concentration of impurities such as hydrogen and water in the film. Thus, the resistivity of the oxide conductive layer can be controlled by selecting treatment for increasing oxygen vacancies and/or impurity concentration or treatment for reducing oxygen vacancies and/or impurity concentration, for an oxide semiconductor layer.

Note that such an oxide conductive layer formed using an oxide semiconductor can also be referred to as an oxide semiconductor layer having a high carrier density and a low resistance, an oxide semiconductor layer having conductivity, or an oxide semiconductor layer having high conductivity.

A transistor included in the display device of this embodiment may have either a top-gate structure or a bottom-gate structure. Gate electrodes may be provided above and below a channel. A semiconductor material used in the transistor is not particularly limited, and examples of the semiconductor material include an oxide semiconductor, silicon, and germanium.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. It is preferable that a semiconductor having crystallinity be used, in which case deterioration of the transistor characteristics can be suppressed.

For example, a Group 14 element, a compound semiconductor, or an oxide semiconductor can be used for the semiconductor layer. Typically, a semiconductor containing silicon, a semiconductor containing gallium arsenide, an oxide semiconductor containing indium, or the like can be used for the semiconductor layer.

An oxide semiconductor is preferably used as a semiconductor in which a channel of the transistor is formed. In particular, an oxide semiconductor having a wider band gap than silicon is preferably used. Using a semiconductor material having a wider band gap and a lower carrier density than silicon is preferable because the off-state current of a transistor can be reduced.

The use of an oxide semiconductor makes it possible to provide a highly reliable transistor in which a change in the electrical characteristics is reduced.

Charge accumulated in a capacitor through the transistor can be retained for a long time because of the low off-state current. The use of such a transistor in a pixel allows a driver circuit to stop with the gray level of a displayed image maintained. As a result, the display device with significantly reduced power consumption can be obtained.

The transistors preferably contain an oxide semiconductor layer that is highly purified to inhibit the formation of oxygen vacancies. This can reduce the current in an off state (off-state current) of the transistors. Accordingly, the retention time of an electrical signal such as an image signal can be made longer, and a writing interval can also be set longer in a power-on state. Accordingly, the frequency of refresh operation can be reduced, which leads to an effect of reducing power consumption.

The transistor using the oxide semiconductor can have relatively high field-effect mobility and thus can operate at high speed. With use of such transistors that are capable of high-speed operation in the display device, the transistor in the display portion and the transistors in the driver circuit portion can be formed over the same substrate. That is, a semiconductor device separately formed with a silicon wafer or the like does not need to be used as the driver circuit, which enables a reduction in the number of components of the display device. In addition, with use of the transistor that can operate at high speed also in the display portion, a high-quality image can be provided.

An organic insulating material or an inorganic insulating material can be used as an insulating material that can be used for the insulating layers, the overcoat, or the like included in the display device. Examples of the organic insulating material include an acrylic resin, an epoxy resin, a polyimide resin, a polyamide resin, a polyimide-amide resin, a siloxane resin, a benzocyclobutene-based resin, and a phenol resin. As inorganic insulating layers, a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, a neodymium oxide film, and the like can be given.

For the conductive layer for the gate, the source, and the drain of the transistor, various wirings and electrodes of the display device, and the like, a single-layer structure or a stacked-layer structure using any of metals such as aluminum, titanium, chromium, nickel, copper, yttrium, zirconium, molybdenum, silver, tantalum, and tungsten, or an alloy containing any of these metals as its main component can be used. For example, a two-layer structure in which a titanium film is stacked over an aluminum film; a two-layer structure in which a titanium film is stacked over a tungsten film; a two-layer structure in which a copper film is stacked over a molybdenum film; a two-layer structure in which a copper film is stacked over an alloy film containing molybdenum and tungsten; a two-layer structure in which a copper film is stacked over an alloy film containing copper, magnesium, and aluminum; a three-layer structure in which a titanium film or a titanium nitride film, an aluminum film or a copper film, and a titanium film or a titanium nitride film are stacked in this order; a three-layer structure in which a molybdenum film or a molybdenum nitride film, an aluminum film or a copper film, and a molybdenum film or a molybdenum nitride film are stacked in this order; or the like can be employed. For example, in the case where the conductive layer has a three-layer structure, it is preferable that each of the first layer and the third layer be a film formed of titanium, titanium nitride, molybdenum, tungsten, an alloy containing molybdenum and tungsten, an alloy containing molybdenum and zirconium, or molybdenum nitride, and that the second layer be a film formed of a low-resistance material such as copper, aluminum, gold, silver, or an alloy containing copper and manganese. Note that light-transmitting conductive materials such as ITO, indium oxide containing tungsten oxide, indium zinc oxide containing tungsten oxide, indium oxide containing titanium oxide, indium tin oxide containing titanium oxide, indium zinc oxide, or ITSO may be used. Note that an oxide conductive layer may be formed by controlling the resistivity of an oxide semiconductor.

A curable resin such as a heat-curable resin, a photocurable resin, or a two-component-mixture-type curable resin can be used as the adhesive layer 141. For example, an acrylic resin, a urethane resin, an epoxy resin, a siloxane resin, or the like can be used.

As the connector 242, for example, an anisotropic conductive film (ACF), an anisotropic conductive paste (ACP), or the like can be used.

As the backlight unit 30, a direct-below backlight, an edge-light type backlight, or the like can be used. As a light source, an LED (Light Emitting Diode), an organic EL (Electroluminescence) element, or the like can be used. The backlight unit 30 can be provided with, for example, light sources 39 emitting red light, green light, and blue light.

The thin films included in the display device (the insulating film, the semiconductor film, the conductive film, and the like) can be formed by a sputtering method, a chemical vapor deposition (CVD) method, a vacuum evaporation method, a pulsed laser deposition (PLD) method, an atomic layer deposition (ALD) method, or the like. As examples of the CVD method, a plasma-enhanced chemical vapor deposition (PECVD) method, a thermal CVD method, and the like can be given. As an example of the thermal CVD method, a metal organic chemical vapor deposition (MOCVD: Metal Organic CVD) method can be given.

The thin films included in the display device (the insulating film, the semiconductor film, the conductive film, and the like) can each be formed by a method such as spin coating, dipping, spray coating, inkjet printing, dispensing, screen printing, offset printing, a doctor knife, slit coating, roll coating, curtain coating, or knife coating.

The thin films included in the display device can be processed using a photolithography method or the like. Alternatively, island-shaped thin films may be formed by a film formation method using a blocking mask. Alternatively, the thin films may be processed by a nano-imprinting method, a sandblasting method, a lift-off method, or the like. Examples of the photolithography method include a method in which a resist mask is formed over a thin film to be processed, the thin film is processed by etching or the like, and the resist mask is removed, and a method in which a photosensitive thin film is formed and then exposed to light and developed to be processed into a desired shape.

As light used for light exposure in a photolithography method, for example, an i-line (a wavelength of 365 nm), a g-line (a wavelength of 436 nm), an h-line (a wavelength of 405 nm), and light in which the i-line, the g-line, and the h-line are mixed can be given. Besides, ultraviolet light, KrF laser light, ArF laser light, or the like can be used. Furthermore, exposure may be performed by liquid immersion light exposure technique. Examples of light used for light exposure include extreme ultraviolet light (EUV) and X-rays. Furthermore, instead of the light used for the exposure, an electron beam can also be used. It is preferable to use extreme ultraviolet light, X-rays, or an electron beam because extremely minute processing can be performed. Note that when exposure is performed by scanning of a beam such as an electron beam, a photomask is unnecessary.

For etching of the thin films, a dry etching method, a wet etching method, a sandblast method, or the like can be used.

[Metal Oxide]

For a semiconductor layer of the transistor included in the display device of this embodiment, a metal oxide functioning as an oxide semiconductor is preferably used. A metal oxide that can be used for the semiconductor layer will be described below.

The metal oxide preferably includes at least indium or zinc. It is particularly preferable that the metal oxide contain indium and zinc. Furthermore, aluminum, gallium, yttrium, tin, or the like is preferably contained in addition to them. Furthermore, one kind or a plurality of kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, an element M, and zinc is considered. Note that the element M is aluminum, gallium, yttrium, tin, or the like. Other elements that can be used as the element M include boron, titanium, iron, nickel, germanium, zirconium, molybdenum, lanthanum, cerium, neodymium, hafnium, tantalum, tungsten, magnesium, and the like. Note that it is sometimes acceptable to use a plurality of the above-described elements in combination as the element M.

Note that in this specification and the like, a metal oxide containing nitrogen is also collectively referred to as a metal oxide in some cases. A metal oxide containing nitrogen may be referred to as a metal oxynitride. For example, a metal oxide containing nitrogen, such as zinc oxynitride (ZnON), may be used for the semiconductor layer.

Oxide semiconductors (metal oxides) can be classified into a single crystal oxide semiconductor and a non-single-crystal oxide semiconductor. Examples of a non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) is difficult to observe even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. By contrast, in the CAAC-OS, a reduction in electron mobility due to the crystal grain boundary is less likely to occur because it is difficult to observe a clear crystal grain boundary. Entry of impurities, formation of defects, or the like might decrease the crystallinity of a metal oxide; thus, it can be said that the CAAC-OS is a metal oxide that has small amounts of impurities and defects (e.g., oxygen vacancies (also referred to as $V_O$)). Thus, a metal oxide including a CAAC-OS is physically stable. Therefore, the metal oxide including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

Note that indium-gallium-zinc oxide (hereinafter referred to as IGZO) that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS includes a void or a low-density region. That is, the a-like OS has low crystallinity as compared with the nc-OS and the CAAC-OS.

An oxide semiconductor (metal oxide) can have various structures which show different properties. Two or more of the amorphous oxide semiconductor, the polycrystalline oxide semiconductor, the a-like OS, the nc-OS, and the CAAC-OS may be included in an oxide semiconductor of one embodiment of the present invention.

A metal oxide film that functions as a semiconductor layer can be formed using either or both of an inert gas and an oxygen gas. Note that there is no particular limitation on the flow rate ratio of oxygen (the partial pressure of oxygen) at the time of forming the metal oxide film. However, to obtain a transistor having high field-effect mobility, the flow rate ratio of oxygen (the partial pressure of oxygen) at the time of forming the metal oxide film is preferably higher than or equal to 0% and lower than or equal to 30%, further preferably higher than or equal to 5% and lower than or equal to 30%, still further preferably higher than or equal to 7% and lower than or equal to 15%.

The energy gap of the metal oxide is preferably 2 eV or more, further preferably 2.5 eV or more, still further preferably 3 eV or more. With use of a metal oxide having such a wide energy gap, the off-state current of the transistor can be reduced.

The metal oxide film can be formed by a sputtering method. Alternatively, a PLD method, a PECVD method, a thermal CVD method, an ALD method, a vacuum evaporation method, or the like may be used.

As described above, the display device of one embodiment of the present invention includes, in the pixel, two capacitors that transmit visible light and overlap with each other; therefore, the pixel can achieve both a high aperture ratio and high storage capacity.

This embodiment can be combined with the other embodiments as appropriate.

Embodiment 3

In this embodiment, the composition of a CAC (Cloud-Aligned Composite)-OS that can be used for a transistor disclosed in one embodiment of the present invention will be described.

The CAC-OS has, for example, a composition in which elements contained in an oxide semiconductor are unevenly distributed. Materials containing unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions containing the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, CAC-OS in an In—Ga—Zn oxide (of the CAC-OS, an In—Ga—Zn oxide may be particularly referred to as CAC-IGZO) has a composition (hereinafter, referred to as cloud-like composition) in which materials are separated into indium oxide (hereinafter, $InO_{X1}$ (X1 is a real number greater than 0)) or indium zinc oxide (hereinafter, $In_{X2}Zn_{Y2}O_{Z2}$ (X2, Y2, and Z2 are real numbers greater than 0)), and gallium oxide (hereinafter, $GaO_{X3}$ (X3 is a real number greater than 0)) or gallium zinc oxide (hereinafter, $Ga_{X4}Zn_{Y4}O_{Z4}$ (X4, Y4, and Z4 are real numbers greater than 0)) to form a mosaic pattern, and $InO_{X1}$ or $In_{X2}Zn_{Y2}O_{Z2}$ forming the mosaic pattern is evenly distributed in the film.

That is, the CAC-OS is a composite oxide semiconductor with a composition in which a region containing $GaO_{X3}$ as a main component and a region containing $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region is described as having higher In concentration than the second region.

Note that IGZO is a common name, which may specify a compound containing In, Ga, Zn, and O. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \le x0 \le 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

The CAC-OS relates to the material composition of an oxide semiconductor. In a material composition of a CAC-OS containing In, Ga, Zn, and O, nanoparticle regions containing Ga as a main component are observed in part of the CAC-OS and nanoparticle regions containing In as a main component are observed in part thereof. These nanoparticle regions are randomly dispersed to form a mosaic pattern. Therefore, the crystal structure is a secondary element for the CAC-OS.

Note that in the CAC-OS, a layered structure including two or more films with different atomic ratios is not included. For example, a two-layer structure of a film containing In as a main component and a film containing Ga as a main component is not included.

A boundary between the region containing $GaO_{X3}$ as a main component and the region containing $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, nanoparticle regions containing the selected metal element(s) as a main component(s) are observed in part of a CAC-OS and nanoparticle regions containing In as a main component are observed in part of the CAC-OS, and these nanoparticle regions are randomly dispersed to form a mosaic pattern in the CAC-OS.

The CAC-OS can be formed by a sputtering method under a condition where a substrate is not heated intentionally, for example. In the case where the CAC-OS is formed by a sputtering method, one or more of an inert gas (typically, argon), an oxygen gas, and a nitrogen gas may be used as a deposition gas. The flow rate of the oxygen gas to the total flow rate of the deposition gas in deposition is preferably as low as possible, for example, the flow rate of the oxygen gas is higher than or equal to 0% and lower than 30%, preferably higher than or equal to 0% and lower than or equal to 10%.

The CAC-OS is characterized in that a clear peak is not observed when measurement is conducted using a θ/2θ scan by an Out-of-plane method, which is an X-ray diffraction (XRD) measurement method. That is, it is found by the X-ray diffraction measurement that there are no alignment in the a-b plane direction and no alignment in the c-axis direction in the measured areas.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes an nc (nano-crystal) structure with no alignment in the plan-view direction and the cross-sectional direction.

Moreover, for example, it can be confirmed by EDX mapping obtained using energy dispersive X-ray spectroscopy (EDX) that the CAC-OS in the In—Ga—Zn oxide has a composition in which regions including $GaO_{X3}$ as a main component and regions including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions containing $GaO_{X3}$ or the like as a main component and regions containing $In_{X2}Zn_{Y2}O_{Z2}$ or $InO_{X1}$ as a main component are separated to form a mosaic pattern.

The conductivity of a region containing $In_{X2}Zn_{Y2}O_{Z2}$ or $InO_{X1}$ as a main component is higher than that of a region containing $GaO_{X3}$ or the like as a main component. In other words, when carriers flow through regions containing $In_{X2}Zn_{Y2}O_{Z2}$ or $InO_{X1}$ as a main component, the conductivity of an oxide semiconductor is generated. Accordingly, when the regions including $In_{X2}Zn_{Y2}O_{Z2}$ or $InO_{X1}$ as a main component are distributed in an oxide semiconductor like a cloud, high field-effect mobility ($\mu$) can be achieved.

In contrast, the insulating property of a region containing $GaO_{X3}$ or the like as a main component is more excellent than that of a region containing $In_{X2}Zn_{Y2}O_{Z2}$ or $InO_{X1}$ as a main component. In other words, when regions containing $GaO_{X3}$ or the like as a main component are distributed in an oxide semiconductor, leakage current can be suppressed and favorable switching operation can be achieved.

Accordingly, when a CAC-OS is used in a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility ($\mu$) can be achieved.

A semiconductor element using a CAC-OS has high reliability. Thus, the CAC-OS is suitably used in a variety of semiconductor devices typified by a display.

This embodiment can be combined with the other embodiments as appropriate.

Embodiment 4

In this embodiment, electronic devices of one embodiment of the present invention will be described with reference to FIG. 19 and FIG. 20.

An electronic device in this embodiment is provided with the display device of one embodiment of the present invention in a display portion. Therefore, the display portion of the electronic device can display a high-quality image.

The display portion of the electronic device in this embodiment can display an image with a resolution of, for example, full high definition, 2K, 4K, 8K, 16K, or higher. In addition, as a screen size of the display portion, the diagonal size can be greater than or equal to 20 inches, greater than or equal to 30 inches, greater than or equal to 50 inches, greater than or equal to 60 inches, or greater than or equal to 70 inches.

Examples of the electronic devices in which the display device of one embodiment of the present invention can be used include a digital camera, a digital video camera, a digital photo frame, a mobile phone, a portable game console, a portable information terminal, and an audio reproducing device, in addition to electronic devices with a relatively large screen, such as a television device, a desktop or notebook personal computer, a monitor for a computer or the like, digital signage, and a large game machine such as a pachinko machine. Furthermore, the display device of one embodiment of the present invention can be suitably used in portable electronic devices, wearable electronic devices (wearable devices), VR (Virtual Reality) devices, AR (Augmented Reality) devices, and the like.

The electronic device of one embodiment of the present invention may include a secondary battery, and it is preferable that the secondary battery be capable of being charged by contactless power transmission.

Examples of the secondary battery include a lithium ion secondary battery such as a lithium polymer battery using a gel electrolyte (lithium ion polymer battery), a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display an image, data, or the like on the display portion. When the electronic device includes the antenna and a secondary battery, the antenna may be used for contactless power transmission.

The electronic device of one embodiment of the present invention may include a sensor (having a function of measuring force, displacement, position, speed, acceleration, angular velocity, rotational frequency, distance, light, liquid, magnetism, temperature, a chemical substance, sound, time, hardness, electric field, current, voltage, electric power, radioactive rays, flow rate, humidity, gradient, oscillation, odor, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Furthermore, an electronic device including a plurality of display portions can have a function of displaying image data mainly on one display portion while displaying text data mainly on another display portion, a function of displaying a three-dimensional image by displaying images on a plurality of display portions with a parallax taken into account, or the like. Furthermore, an electronic device including an image receiving portion can have a function of taking a still image or a moving image, a function of automatically or manually correcting a taken image, a function of storing a taken image in a recording medium (an external recording medium or a recording medium incorporated in the electronic device), a function of displaying a taken image on a display portion, or the like. Note that functions of the electronic device of one embodiment of the present invention are not limited thereto, and the electronic devices can have a variety of functions.

Figure 19A:
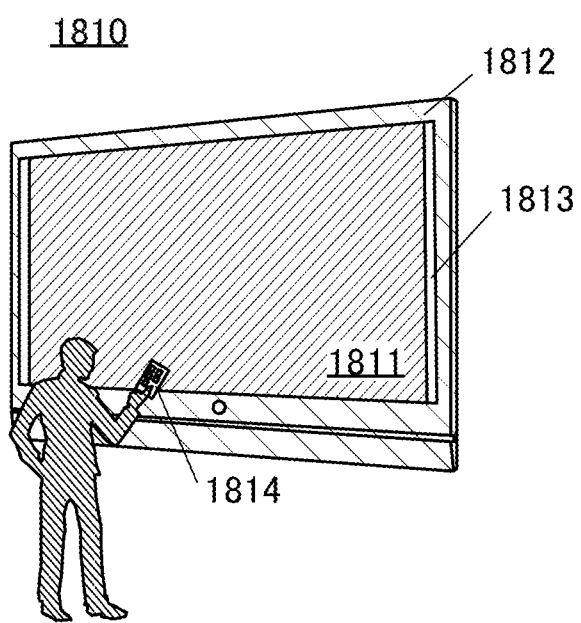
FIGS. 19 (A), (B), and (C) are diagrams each illustrating an example of an electronic device.

FIG. 19(A) illustrates a television device 1810. The television device 1810 includes a display portion 1811, a housing 1812, a speaker 1813, and the like. Furthermore, the television device can include an LED lamp, operation keys (including a power switch or an operation switch), a connection terminal, a variety of sensors, a microphone, and the like.

The television device 1810 can be controlled with a remote controller 1814.

As airwaves the television device 1810 can receive, ground waves, waves transmitted from a satellite, and the like can be given. The example of the airwaves also include analog broadcasting, digital broadcasting, image-sound-only broadcasting, and sound-only broadcasting. For example, the television device 1810 can receive airwaves transmitted in a certain frequency band in a UHF band (about 300 MHz to 3 GHz) or a VHF band (30 MHz to 300 MHz). When a plurality of pieces of data received in a plurality of frequency bands are used, the transfer rate can be increased and more information can be obtained. Accordingly, the display portion 1811 can display an image with a resolution higher than the full high definition. For example, an image with a resolution of 4K, 8K, 16K, or higher can be displayed.

A structure may be employed in which an image to be displayed on the display portion 1811 is generated using broadcasting data transmitted with a technology for transmitting data via a computer network such as the Internet, a LAN (Local Area Network), or Wi-Fi (registered trademark). In that case, the television device 1810 does not necessarily include a tuner.

Figure 19B:
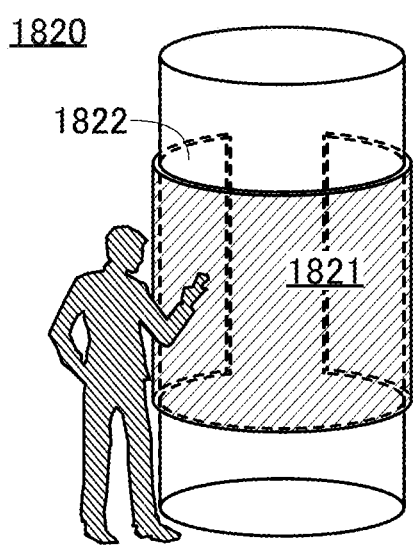

FIG. 19(B) illustrates a digital signage 1820 mounted on a cylindrical pillar 1822. The digital signage 1820 includes a display portion 1821.

The larger the display portion 1821 is, the more information the display portion 1821 can provide at a time. In addition, the larger the display portion 1821 is, the more the display portion 1821 attracts attention, so that the effectiveness of the advertisement can be increased, for example.

It is preferable to use a touch panel in the display portion 1821 because not only a still image or a moving image is displayed on the display portion 1821 but also users can operate intuitively. Moreover, for an application for providing information such as route information or traffic information, usability can be enhanced by intuitive operation.

Figure 19C:
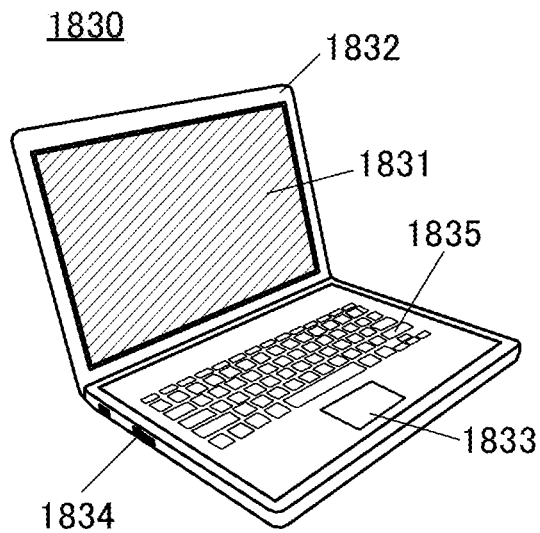

FIG. 19(C) illustrates a notebook personal computer 1830. The personal computer 1830 includes a display portion 1831, a housing 1832, a touch pad 1833, a connection port 1834, and the like.

The touch pad 1833 functions as an input means such as a pointing device or a pen tablet and can be controlled with a finger, a stylus, or the like.

Furthermore, a display unit is incorporated in the touch pad 1833. As illustrated in FIG. 19(C), when input keys 1835 are displayed on a surface of the touch pad 1833, the touch pad 1833 can be used as a keyboard. In that case, a vibration module may be incorporated in the touch pad 1833 so that sense of touch is achieved by vibration when the input keys 1835 are touched.

Figure 20A:
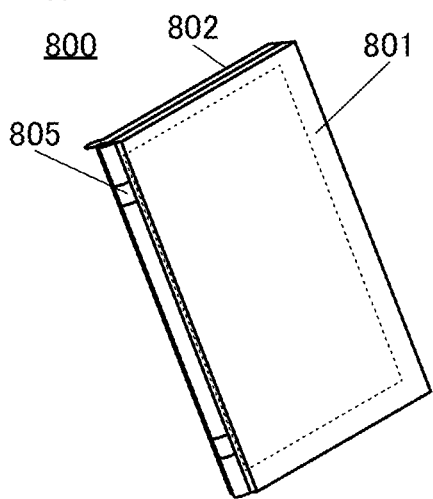
FIGS. 20 (A), (B), (C), (D), and (E) are diagrams illustrating examples of electronic devices.
Figure 20B:
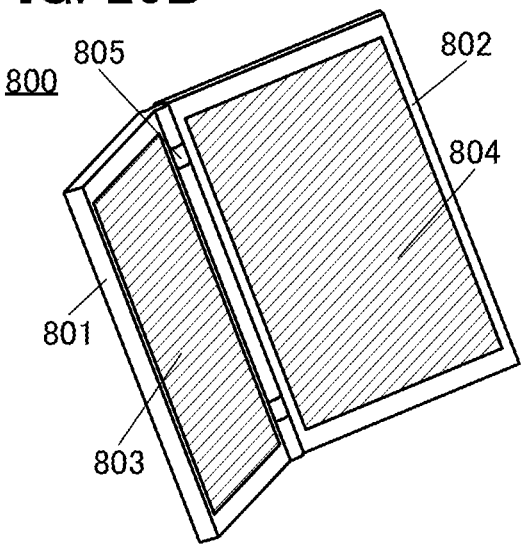

FIGS. 20(A) and 20(B) illustrate an example of a portable information terminal 800. The portable information terminal 800 includes a housing 801, a housing 802, a display portion 803, a display portion 804, a hinge portion 805, and the like.

The housing 801 and the housing 802 are joined together with the hinge portion 805. As for the portable information terminal 800, the housing 801 and the housing 802 can be opened as illustrated in FIG. 260B) from a folded state illustrated in FIG. 20(A).

For example, text information can be displayed on the display portion 803 and the display portion 804; thus, the portable information terminal can be used as an e-book reader. Furthermore, still images and moving images can be displayed on the display portion 803 and the display portion 804.

The portable information terminal 800 can be folded when being carried, and thus is highly versatile.

Note that the housing 801 and the housing 802 may have a power button, an operation button, an external connection port, a speaker, a microphone, and the like.

Figure 20C:
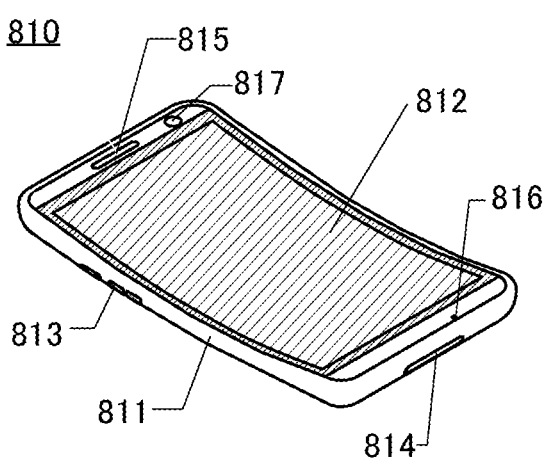

FIG. 20(C) illustrates an example of a portable information terminal. A portable information terminal 810 illustrated in FIG. 20(C) includes a housing 811, a display portion 812, an operation button 813, an external connection port 814, a speaker 815, a microphone 816, a camera 817, and the like.

The portable information terminal 810 includes a touch sensor in the display portion 812. Operations such as making a call and inputting text can be performed by touching the display portion 812 with a finger, a stylus, or the like.

By an operation with the operation button 813, power on/off operations and types of images displayed on the display portion 812 can be switched. For example, switching from a mail creation screen to a main menu screen can be performed.

When a detection device such as a gyroscope sensor or an acceleration sensor is provided inside the portable information terminal 810, the direction of display on the screen of the display portion 812 can be automatically changed by determining the orientation (horizontal or vertical) of the portable information terminal 810. Furthermore, the direction of display on the screen can be changed by touch on the display portion 812, operation with the operation button 813, sound input using the microphone 816, or the like.

The portable information terminal 810 functions as, for example, one or more selected from a telephone set, a notebook, an information browsing device, and the like. Specifically, the portable information terminal can be used as a smartphone. The portable information terminal 810 is capable of executing a variety of applications such as mobile phone calls, e-mailing, text viewing and writing, music replay, video replay, Internet communication, and games, for example.

Figure 20D:
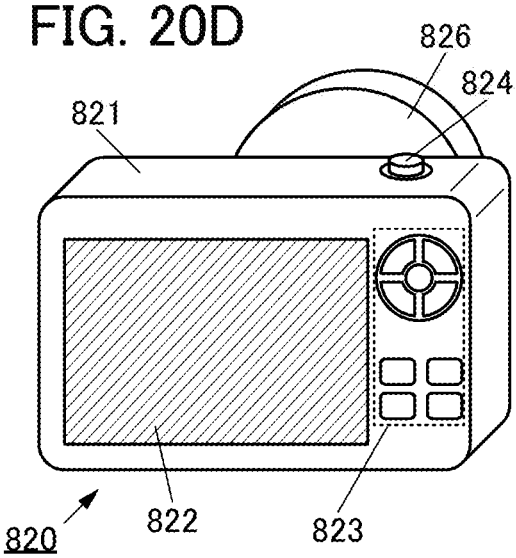

FIG. 20(D) illustrates an example of a camera. A camera 820 includes a housing 821, a display portion 822, operation buttons 823, a shutter button 824, and the like. Furthermore, a detachable lens 826 is attached to the camera 820.

Although the lens 826 of the camera 820 here is detachable from the housing 821 for replacement, the lens 826 may be integrated with the housing.

A still image or a moving image can be taken with the camera 820 at the press of the shutter button 824. In addition, the display portion 822 has a function of a touch panel, and images can also be taken by the touch on the display portion 822.

Note that a stroboscope, a viewfinder, or the like can be additionally attached to the camera 820. Alternatively, these may be incorporated into the housing 821.

Figure 20E:
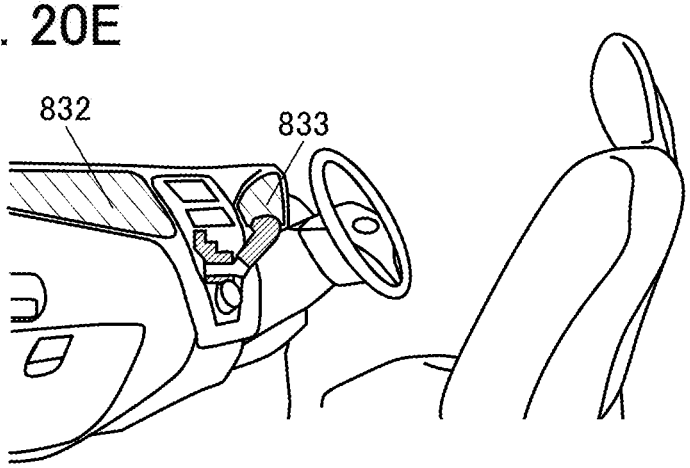

FIG. 20(E) illustrates an example in which the display device of one embodiment of the present invention is used as an in-vehicle display. A display portion 832 and a display portion 833 can provide various kinds of information by displaying navigation information, a speedometer, a tachometer, a mileage, a fuel meter, a gearshift indicator, air-conditioning settings, and the like. The content or layout of the display can be changed freely in accordance with the preference of a user.

As described above, electronic devices can be obtained by application of the display device of one embodiment of the present invention. The display device has a significantly wide application range, and can be used in electronic devices in a variety of fields.

This embodiment can be combined with the other embodiments as appropriate.

REFERENCE NUMERALS

10: display device, 11: pixel, 12: display portion, 13: gate driver, 14: source driver, 15a: memory circuit, 15b: memory circuit, 15c: memory circuit, 20: wiring, 21: wiring, 22: wiring, 23: wiring, 30: backlight unit, 31: wiring, 32: wiring, 33: wiring, 38: light-blocking layer, 39: light source, 40: transistor, 41: transistor, 42: transistor, 43: transistor, 45: insulating layer, 46: conductive layer, 46a: conductive layer, 46b: conductive layer, 51: capacitor, 52: capacitor, 53: capacitor, 54: capacitor, 60: display unit, 61: wiring, 62: wiring, 63: wiring, 110: display device, 111: pixel, 112: display portion, 121: pixel electrode, 122: liquid crystal layer, 123: common electrode, 123a: common electrode, 123b: conductive layer, 133a: alignment film, 133b: alignment film, 135: overcoat, 141: adhesive layer, 144: insulating layer, 161: polarizing plate, 163: polarizing plate, 172: FPC, 210: display device, 211: gate insulating layer, 212: insulating layer, 213: insulating layer, 214: insulating layer, 215: insulating layer, 217: insulating layer, 218: insulating layer, 221: gate, 22a: gate, 22b: gate, 222a: conductive layer, 222b: conductive layer, 222c: conductive layer, 222d: conductive layer, 222e: conductive layer, 223: gate, 223a: gate, 223b: gate, 225: gate insulating layer, 225a: gate insulating layer, 225b: gate insulating layer, 231: wiring, 232: wiring, 241: semiconductor layer, 24a: semiconductor layer, 24b: semiconductor layer, 241i: channel formation region, 241n: low-resistance region, 242: connector, 310: display device, 331: substrate, 332: substrate, 800: portable information terminal, 801: housing, 802: housing, 803: display portion, 804: display portion, 805: hinge portion, 810: portable information terminal, 811: housing, 812: display portion, 813: operation button, 814: external connection port, 815: speaker, 816: microphone, 817: camera, 820: camera, 821: housing, 822: display portion, 823: operation button, 824: shutter button, 826: lens, 832: display portion, 833: display portion, 1810: television device, 1811: display portion, 1812: housing, 1813: speaker, 1814: remote controller, 1820: digital signage, 1821: display portion, 1822: pillar, 1830: personal computer, 1831: display portion, 1832: housing, 1833: touch pad, 1834: connection port, 1835: input key This application is based on Japanese Patent Application Serial No. 2018-030779 filed with Japan Patent Office on Feb. 23, 2018 and Japanese Patent Application Serial No. 2018-045614 filed with Japan Patent Office on Mar. 13, 2018, the entire contents of which are hereby incorporated herein by reference.

The invention claimed is:

1. A method for operating a display device comprising a pixel provided with a first memory circuit, a second memory circuit, and a display unit, the method comprising:
a first period of writing first image data to the first memory circuit and writing second image data to the second memory circuit;
a second period of supplying a first potential to the first memory circuit;
a third period of displaying a first image corresponding to the first image data;
a fourth period of setting a potential of one electrode of the display unit to a second potential;
a fifth period of supplying the first potential to the second memory circuit; and
a sixth period of displaying a second image corresponding to the second image data,
wherein the first memory circuit comprises a first transistor and a first capacitor,
wherein the second memory circuit comprises a second transistor and a second capacitor,
wherein one of a source and a drain of the first transistor is electrically connected to one electrode of the first capacitor,
wherein one of a source and a drain of the second transistor is electrically connected to one electrode of the second capacitor, and
wherein the other electrode of the first capacitor and the other electrode of the second capacitor are electrically connected to the one electrode of the display unit.

2. The method for operating a display device according to claim 1,
wherein the first image is an image of a first color, and
wherein the second image is an image of a second color.

3. The method for operating a display device according to claim 2,
wherein the first color is one of red, green, and blue, and
wherein the second color is one of red, green, and blue and different from the first color.

4. The method for operating a display device according to claim 1,
wherein the display unit is a liquid crystal unit.

5. The method for operating a display device according to claim 1,
wherein the display device comprises a source driver,
wherein the source driver is electrically connected to the first memory circuit through a first data line,
wherein the source driver is electrically connected to the second memory circuit through a second data line, and
wherein the source driver is configured to generate the first image data, the second image data, and the first potential.

6. The method for operating a display device according to claim 5,
wherein the one of the source and the drain of the first transistor is directly connected to the one electrode of the first capacitor,
wherein the one of the source and the drain of the second transistor is directly connected to the one electrode of the second capacitor, and
wherein the other electrode of the first capacitor and the other electrode of the second capacitor are directly connected to the one electrode of the display unit.

7. The method for operating a display device according to claim 6,
wherein the first transistor and the second transistor each comprise a metal oxide in a channel formation region, and
wherein the metal oxide comprises In, Zn, and M (M is Al, Ti, Ga, Sn, Y, Zr, La, Ce, Nd, or Hf).

8. A display device comprising:
a first pixel;
a second pixel; and
a source driver,
wherein the first pixel comprises a first memory circuit, a second memory circuit, a third memory circuit, and a first display unit,
wherein the second pixel comprises a fourth memory circuit, a fifth memory circuit, a sixth memory circuit, and a second display unit,
wherein the first memory circuit is electrically connected to a first data line,
wherein the first memory circuit is electrically connected to one electrode of the first display unit, wherein the second memory circuit is electrically connected to a second data line,
wherein the second memory circuit is electrically connected to the one electrode of the first display unit,
wherein the third memory circuit is electrically connected to the second data line,
wherein the third memory circuit is electrically connected to the one electrode of the first display unit,
wherein the fourth memory circuit is electrically connected to the first data line,
wherein the fourth memory circuit is electrically connected to one electrode of the second display unit,
wherein the fifth memory circuit is electrically connected to the first data line,
wherein the fifth memory circuit is electrically connected to the one electrode of the second display unit,
wherein the sixth memory circuit is electrically connected to the second data line,
wherein the sixth memory circuit is electrically connected to the one electrode of the second display unit,
wherein the source driver is electrically connected to the first data line and the second data line,
wherein the source driver is configured to generate first image data, second image data, third image data, fourth image data, fifth image data, sixth image data, and a first potential,
wherein the first memory circuit is configured to retain the first image data,
wherein the second memory circuit is configured to retain the second image data,
wherein the third memory circuit is configured to retain the third image data,
wherein the fourth memory circuit is configured to retain the fourth image data,
wherein the fifth memory circuit is configured to retain the fifth image data,
wherein the sixth memory circuit is configured to retain the sixth image data,
wherein the first pixel is configured to read the first image data from the first memory circuit when the first potential is supplied to the first memory circuit,
wherein the first pixel is configured to read the second image data from the second memory circuit when the first potential is supplied to the second memory circuit,
wherein the first pixel is configured to read the third image data from the third memory circuit when the first potential is supplied to the third memory circuit, and
wherein the second pixel is configured to read the fourth image data from the fourth memory circuit when the first potential is supplied to the fourth memory circuit,
wherein the second pixel is configured to read the fifth image data from the fifth memory circuit when the first potential is supplied to the fifth memory circuit, and
wherein the second pixel is configured to read the sixth image data from the sixth memory circuit when the first potential is supplied to the sixth memory circuit.

9. The display device according to claim 8,
wherein the display device comprises a first transistor,
wherein one of a source and a drain of the first transistor is electrically connected to the one electrode of the first display unit and the one electrode of the second display unit,
wherein the other of the source and the drain of the first transistor is electrically connected to a power supply line,
wherein the source driver is configured to generate the first to sixth image data in a period when the first transistor is in a conduction state, and
wherein the source driver is configured to generate the first potential in a period when the first transistor is in a non-conduction state.

10. The display device according to claim 8,
wherein the first image data and the fourth image data each represent an image of a first color,
wherein the second image data and the fifth image data each represent an image of a second color, and
wherein the third image data and the sixth image data each represent an image of a third color.

11. The display device according to claim 10,
wherein the first color is one of red, green, and blue, and
wherein the second color is one of red, green, and blue and different from the first color,
wherein the third color is one of red, green, and blue and different from the first color and the second color.

12. The display device according to claim 8,
wherein the first display unit is a liquid crystal unit.

13. The display device according to claim 8,
wherein the display device comprises a first transistor,
wherein the first memory circuit comprises a second transistor and a first capacitor,
wherein the second memory circuit comprises a third transistor and a second capacitor,
wherein the third memory circuit comprises a fourth transistor and a third capacitor,
wherein the fourth memory circuit comprises a fifth transistor and a fourth capacitor,
wherein the fifth memory circuit comprises a sixth transistor and a fifth capacitor,
wherein the sixth memory circuit comprises a seventh transistor and a sixth capacitor,
wherein one of a source and a drain of the second transistor is electrically connected to one electrode of the first capacitor,
wherein the other of the source and the drain of the second transistor is electrically connected to the first data line,
wherein the other electrode of the first capacitor is electrically connected to the one electrode of the first display unit,
wherein one of a source and a drain of the third transistor is electrically connected to one electrode of the second capacitor,
wherein the other of the source and the drain of the third transistor is electrically connected to the second data line,
wherein the other electrode of the second capacitor is electrically connected to the one electrode of the first display unit,
wherein one of a source and a drain of the fourth transistor is electrically connected to one electrode of the third capacitor,
wherein the other of the source and the drain of the fourth transistor is electrically connected to the second data line,
wherein the other electrode of the third capacitor is electrically connected to the one electrode of the first display unit,
wherein one of a source and a drain of the fifth transistor is electrically connected to one electrode of the fourth capacitor,
wherein the other of the source and the drain of the fifth transistor is electrically connected to the first data line, wherein the other electrode of the fourth capacitor is electrically connected to the one electrode of the second display unit, wherein one of a source and a drain of the sixth transistor is electrically connected to one electrode of the fifth capacitor, wherein the other of the source and the drain of the sixth transistor is electrically connected to the first data line, wherein the other electrode of the fifth capacitor is electrically connected to the one electrode of the second display unit, wherein one of a source and a drain of the seventh transistor is electrically connected to one electrode of the sixth capacitor, wherein the other of the source and the drain of the seventh transistor is electrically connected to the second data line, wherein the other electrode of the sixth capacitor is electrically connected to the one electrode of the second display unit, and wherein a gate of the first transistor is electrically connected to a gate of the third transistor.

14. The display device according to claim 13, wherein the second to seventh transistors each comprise a metal oxide in a channel formation region, and wherein the metal oxide comprises In, Zn, and M (M is Al, Ti, Ga, Sn, Y, Zr, La, Ce, Nd, or Hf).

* * * * *